(12) United States Patent
Okamoto et al.

(10) Patent No.: US 8,355,224 B2
(45) Date of Patent: Jan. 15, 2013

(54) SENSOR SHAPE OF A CPP MAGNETIC HEAD FOR IMPROVING THE MR RATIO

(75) Inventors: Satoru Okamoto, Kanagawa (JP); Koji Okazaki, Kanagawa (JP); Shuuichi Kojima, Kanagawa (JP); Nobuo Yoshida, Kanagawa (JP); Katsuro Watanabe, Ibaraki (JP); Hiroyuki Katada, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1374 days.

(21) Appl. No.: 12/011,904

(22) Filed: Jan. 29, 2008

(65) Prior Publication Data

US 2009/0046394 A1    Feb. 19, 2009

(30) Foreign Application Priority Data

Jan. 29, 2007    (JP) ................... 2007-018450

(51) Int. Cl.
*G11B 5/33* (2006.01)
(52) U.S. Cl. ....................................... 360/319
(58) Field of Classification Search .................. 360/319
See application file for complete search history.

(56) References Cited

U.S. PATENT DOCUMENTS

| | | | |
|---|---|---|---|
| 6,329,211 B1 | 12/2001 | Terunuma et al. | |
| 7,768,747 B2 * | 8/2010 | Kagami et al. | 360/319 |
| 2004/0100737 A1 * | 5/2004 | Nakamoto et al. | 360/319 |
| 2004/0150922 A1 | 8/2004 | Kagami et al. | |
| 2005/0264948 A1 * | 12/2005 | Nakamoto et al. | 360/319 |
| 2006/0056117 A1 * | 3/2006 | Miyauchi et al. | 360/324.12 |
| 2006/0291097 A1 * | 12/2006 | Honda et al. | 360/126 |
| 2008/0253036 A1 * | 10/2008 | Kagami et al. | 360/319 |

FOREIGN PATENT DOCUMENTS

| | | |
|---|---|---|
| JP | 2002-026423 A | 1/2002 |
| JP | 2003-198000 A | 7/2003 |

* cited by examiner

*Primary Examiner* — David D Davis
(74) *Attorney, Agent, or Firm* — Patterson & Sheridan, LLP

(57) ABSTRACT

Embodiments of the present invention help to prevent a head characteristic from being deteriorated by re-deposition or damage which occurs when a sensor film is etched, a track width is narrowed, and the head characteristic is stabilized. According to one embodiment, when it is assumed that the thickness of the sensor film on an air bearing surface is T, and a distance between an end of a medium layer that is interposed between a free layer and a pinned layer which comprise the sensor film and an end of the sensor film lowest portion, a relationship of $1.2 \times T \leqq X \leqq 2.5 \times T$ is satisfied, and the ends of a pair of magnetic films which are in contact with both sides in the track-width direction through an insulator do not exist in the track central portion from the free layer end. The sensor film is etched while an incident angle of an etching beam is changed over, and when it is assumed that a direction normal to the sensor film surface is the incident angle of 0, etching is conducted under the condition where the incident angle of the etching beam becomes smaller with time.

13 Claims, 21 Drawing Sheets

Fig.5
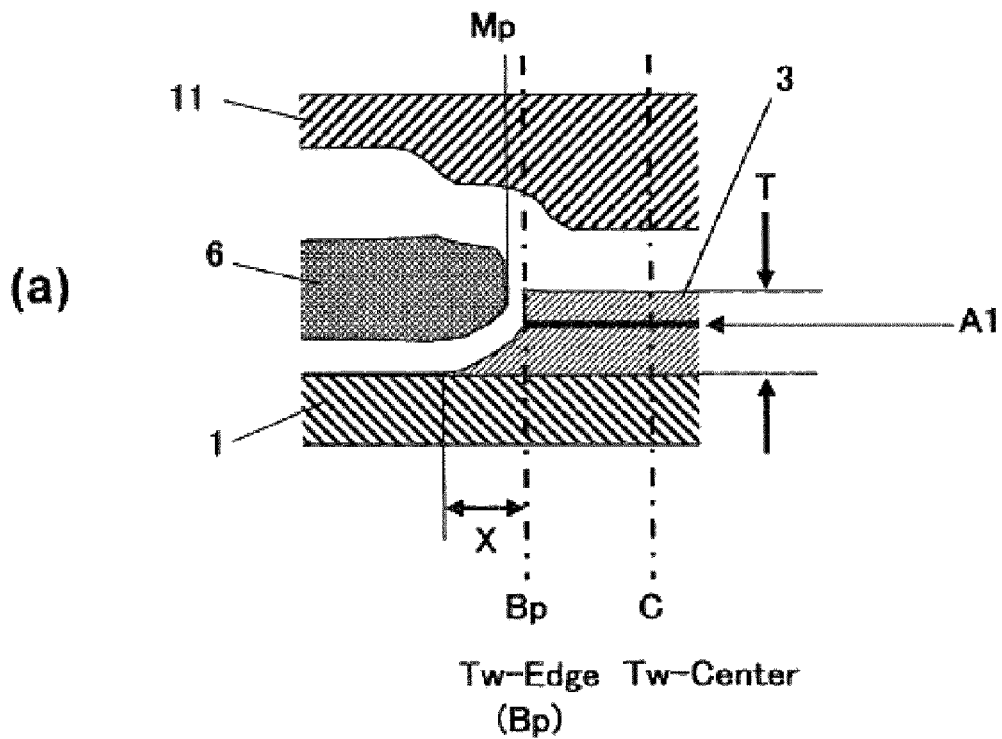
(a)
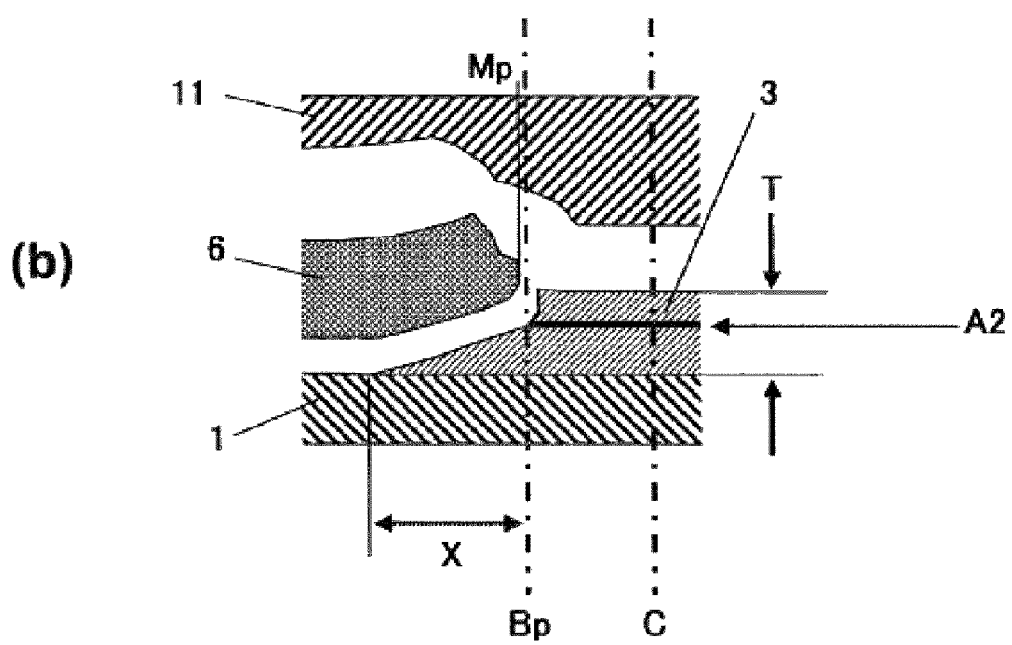
(b)

Fig.6
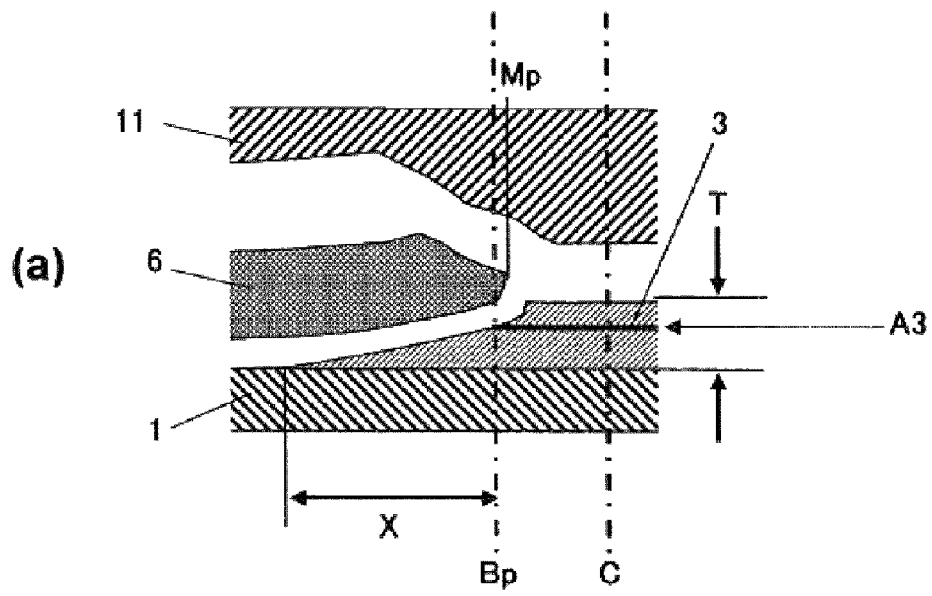
(a)
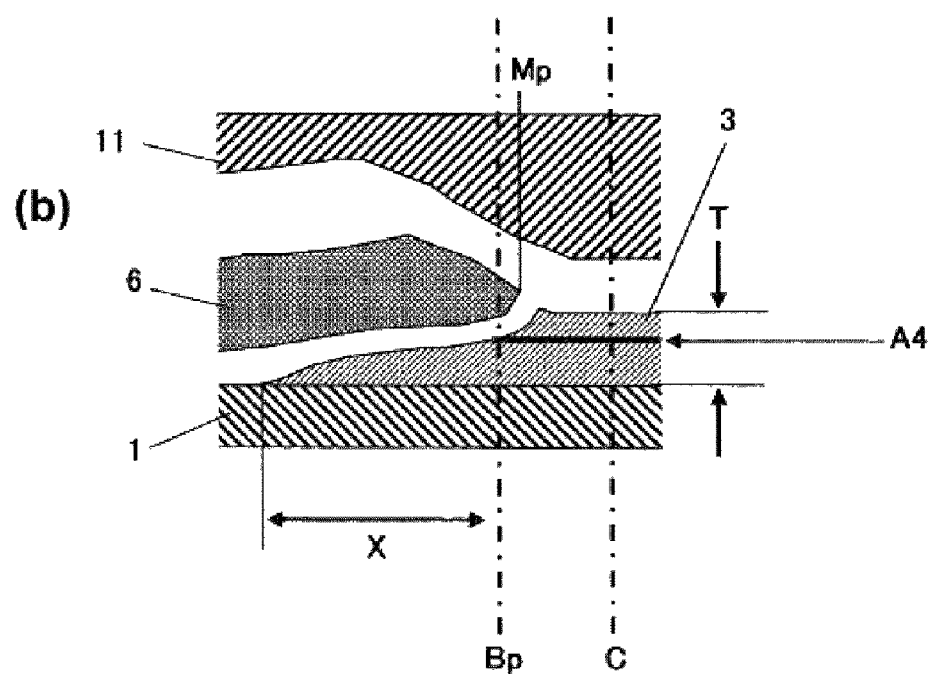
(b)

Fig.14
(a)
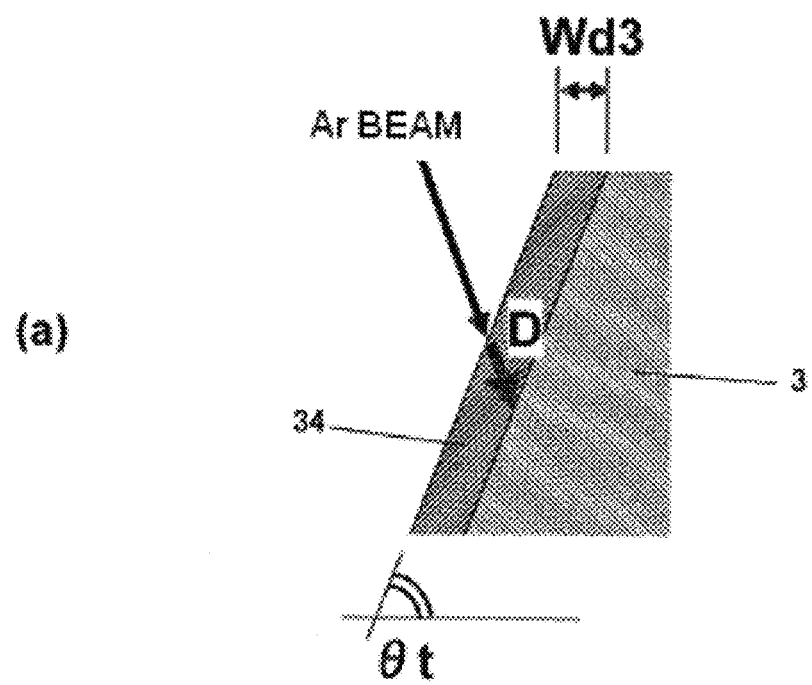
(b)
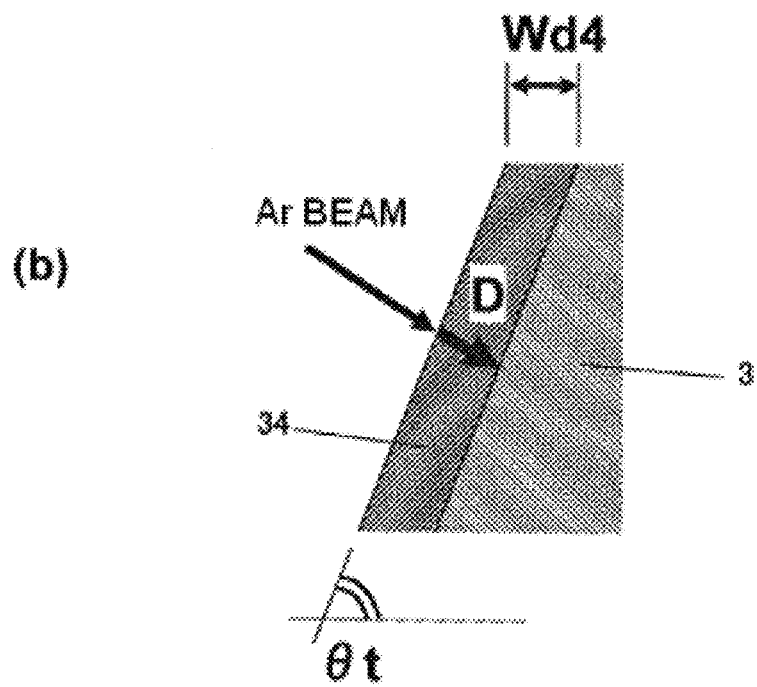

Fig.18
(a) 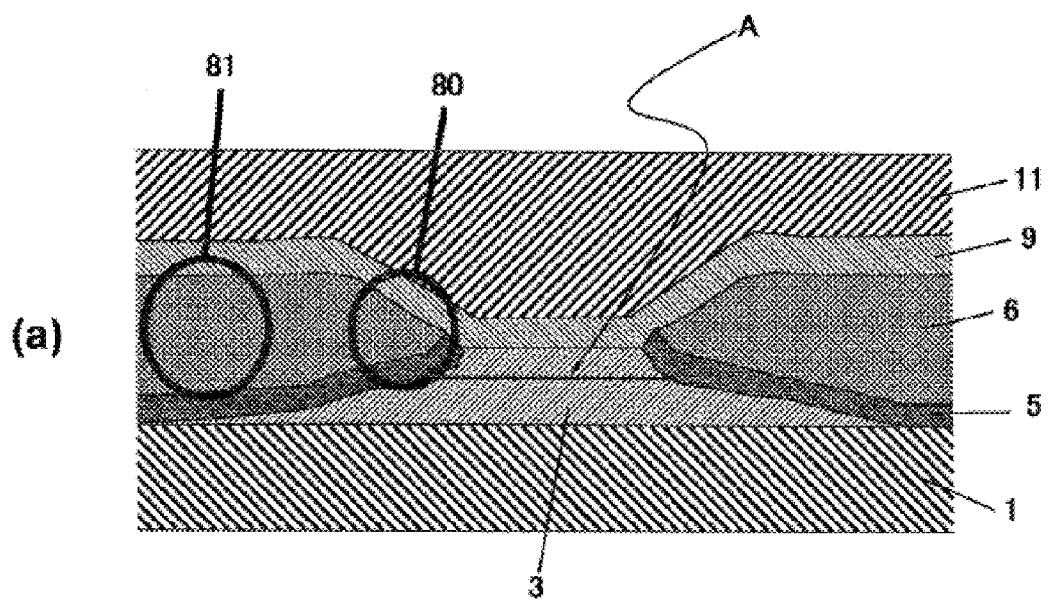
(b) 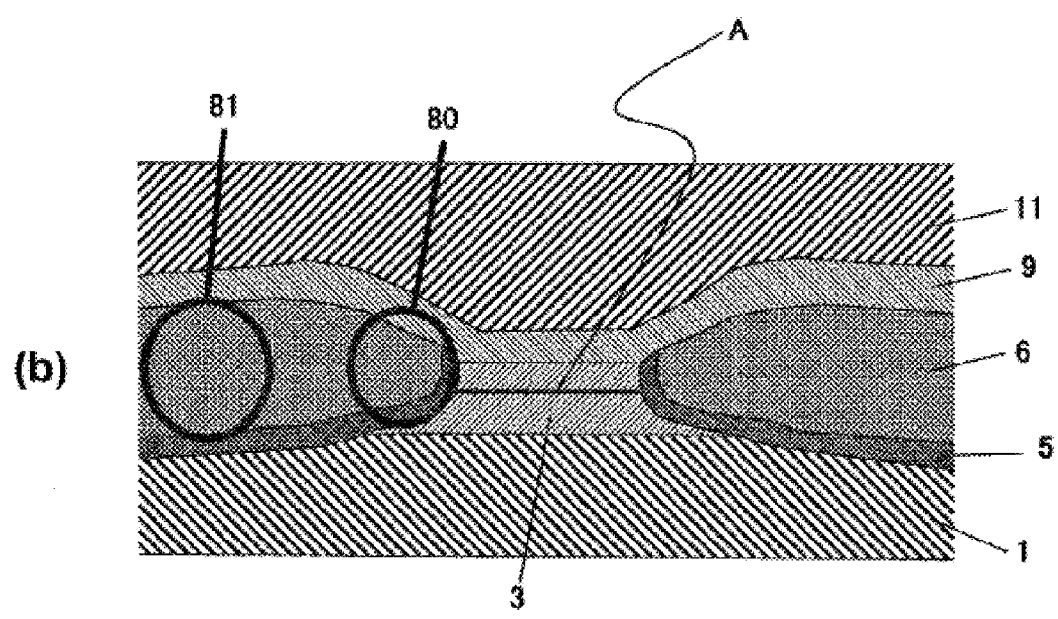

Fig.20
(a)
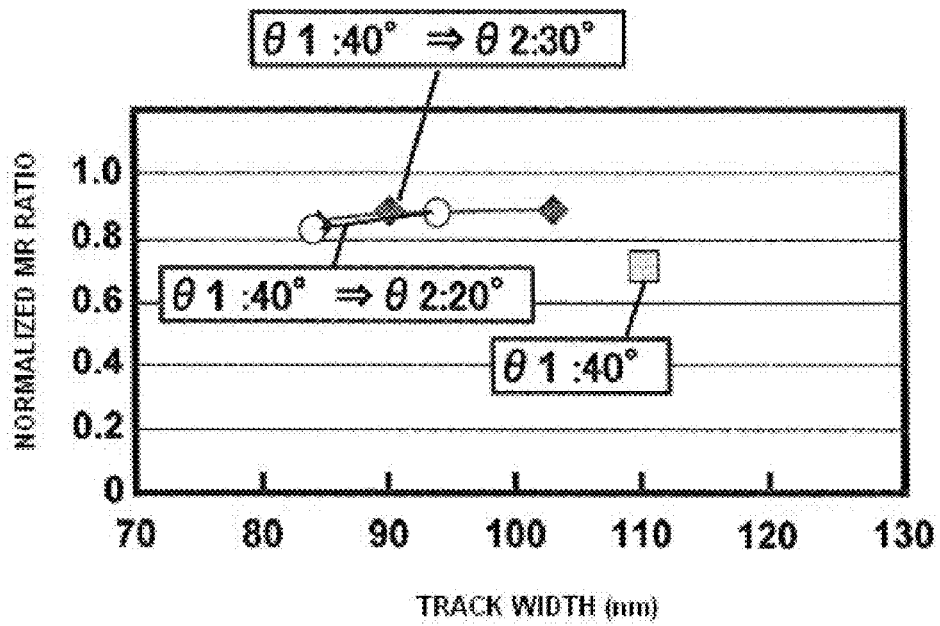
(b)
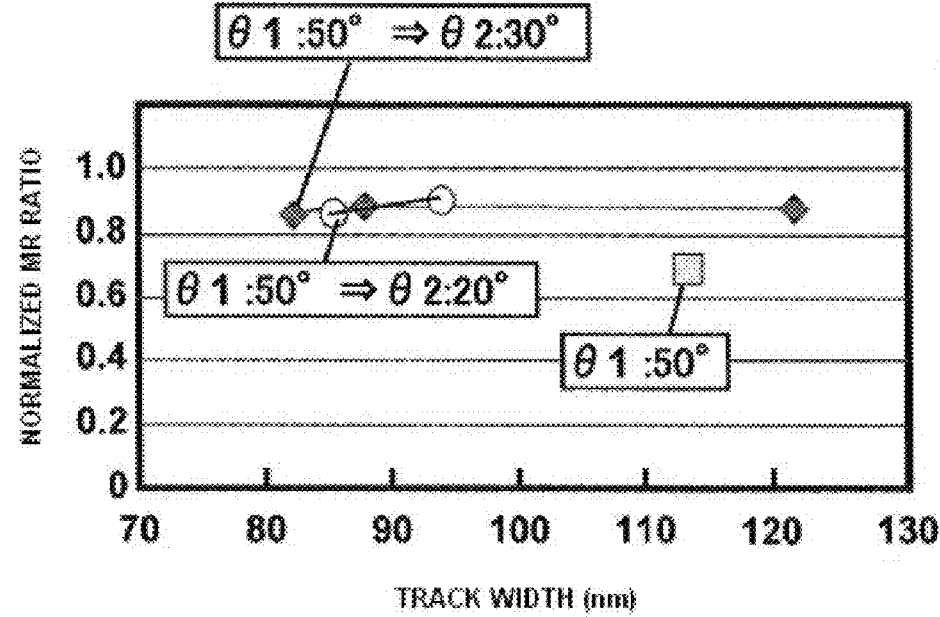

SENSOR SHAPE OF A CPP MAGNETIC HEAD FOR IMPROVING THE MR RATIO

CROSS-REFERENCE TO RELATED APPLICATION

The instant nonprovisional patent application claims priority to Japanese Patent Application No. 2007-018450 filed Jan. 29, 2007 and which is incorporated by reference in its entirety herein for all purposes.

BACKGROUND OF THE INVENTION

With the higher recording density of a hard disk drive (HDD), a demand has been made that the mounted thin film magnetic head is further made narrow in track width and gap length and further enhanced in the sensitivity. At the present day, there has been used the thin film magnetic head having a write head and a read head combined together. A giant magnetoresistive (GMR) head using the GMR effect has been mainly used as the read head. The GMR head is a head of the CIP (current in plane) type which allows an electric signal to flow in the sensor film in parallel to the film plane. In order to further improve the recording density in the future, a TMR (tunneling magneto resistive effect) head and a CPP-GMR (current perpendicular to a plane-giant magneto resistive effect) head which appear to be advantageous to the high output have been actively developed in narrowing the tracks and the gaps. The TMR head and the CPP-GMR head are different from the conventional GMR head, and not the CIP type head that allows the electric signal to flow in the sensor film in parallel to the film plane, but the CPP type head that allows the electric current to flow therein in a direction perpendicular to the film plane, which is largely different therefrom.

Japanese Patent Publication No. 2002-26423 ("Patent Document 1") discloses a method of etching the sensor film. In the method, etching operation is divided into two steps, and a first step is conducted at an etching beam incident angle (milling angle) of about 20°, and a second step is conducted at the incident angle of about 75°. The above etching process taking re-deposition removal into consideration is disclosed in a process of etching the write head. Japanese Patent Publication No. 2000-105906 ("Patent Document 2) has proposed that a step A and a step B are repetitively conducted several times, the etching operation is conducted in the step A, and the re-deposition removal is conducted in the step B. When it is assumed that the incident angle of the step A is $\theta A$, and the incident angle of the step B is $\theta B$, a relationship of $\theta A<\theta B$ is satisfied.

Japanese Patent Publication No. 2003-198000 ("Patent Document 3) discloses a CPP-GMR head that is the CPP type head. A lower lead that comes in contact with the sensor film has a convex configuration, and a width that comes in contact with the sensor film of the upper lead is made smaller than the lower lead, to thereby improve an alignment margin and form a fine contact portion. Japanese Patent Publication No. 2004-241763 ("Patent Document 4") has proposed that in order to prevent the characteristics of the TMR head from being deteriorated due to an annealing process, a film for protecting a wall surface of the sensor film is arranged after the sensor film has been etched.

Also, in order to further increase the output, the sensor per se has been increasingly improved. For example, in the case of the TMR, alumina: Al-Ox has been generally known as a barrier layer. When MgO is used as the barrier layer, another MR ratio is obtained. Also, in the case of the CPP-GMR, an oxidized layer is partially arranged on a part of the sensor film, to thereby improve the MR ratio.

In the CPP type head, the upper and lower shields that are used as the magnetic shield also serve as electrodes. Then, an insulator is disposed on a wall surface of the sensor film, and electrodes are disposed on the upper and lower surfaces of the sensor film to allow a current to flow in a direction perpendicular to the film surface. In the case of the above CPP type head structure, an influence of re-deposition that occurs when the sensor film is etched becomes very remarkable. For example, in the case of the TMR head, magnetic layers are disposed on the upper and lower surfaces of a tunneling barrier layer that generates the tunneling effect as the sensor film structure. However, when the re-deposition layer is formed on the etching wall surface of the tunneling barrier layer when the sensor film is etched, the re-deposition layer forms a leak path of the current with the result that the electric resistance and the electric output are significantly decreased.

In the case where the sense current is allowed to flow in the direction perpendicular to the film surface as described above, when an undesired current path, that is, short-circuiting occurs between the upper and lower leads, the current path causes a fatal defect. In particular, the re-deposition in the sensor film etching process as described above is liable to cause the short-circuiting. In order to prevent the short-circuiting that is attributable to the above re-deposition, the re-deposition removal is conducted. However, there is a fear that the sensor film is damaged in the re-deposition removing process. A manufacturing method including the re-deposition removal will be described with reference to FIG. 24. In this example, the TMR film is used as the sensor film. After a track forming resist mask (etching mask) 4 has been formed on the sensor film 3 as shown in FIG. 24($a$), an Ar beam is input at an incident angle $\theta A$ as shown in FIG. 24($b$) to etch the TRM film. A re-deposition 33 is formed thicker as the incident angle $\theta A$ is smaller. In the case where the etching operation has been completed in that state, short-circuiting occurs on the re-deposition 33, to thereby cause the fatal detect. Under the circumstances, as shown in FIG. 24($c$), the Ar beam is input to the incident angle $\theta B$ to remove the re-deposition 33. As usual, the incident angle $\theta B$ to be used is about 65° to 75°. Because it is difficult to etch only the re-deposition in the re-deposition removing process, the sensor film 3 is slightly etched by the Ar beam. That is, because the sensor film wall surface per se is irradiated with the Ar beam, there is a fear that the magnetic layer and the barrier layer are damaged, and the interface of those multilayer films is damaged.

It appears that the influences of the above re-deposition and damage get further serious by narrowing the tracks in the future. The reason is that, for example, in the case of the re-deposition, the head resistance becomes larger as the tracks are made narrower, and an influence of the resistance reduction due to the re-deposition is increased as much as the head resistance is increased. In the case of the damage, the ratio of the damage to the width or volume of the sensor film becomes large, and the MR ratio appears to be smaller. Also, there is the possibility that the resistance of the damaged portion becomes low as with the re-deposition, and the characteristic deterioration occurs as with the above-mentioned re-deposition.

In Patent Document 1, the sensor film is etched in a first process, and the re-deposition that has been formed in the first process is removed in a second process. When it is assumed that the beam incident angle in the first process is $\theta 1$ (about 20°), and the beam incident angle in the second process is $\theta 2$ (about 75°), a relationship of $\theta 1<\theta 2$ is satisfied. In this case, there is a fear that the sensor film is damaged in removing the re-deposition. Also, there is a fear that the configuration of the sensor film end is deteriorated by the re-deposition removal. The sensor film is formed of a multilayer film made of diverse materials, and there is the possibility that the etching rates of the respective layers are different from each other. For that reason, there is the possibility that roughness occurs on the wall surface due to the difference in the etching rate to generate the configuration failure in the re-deposition removing processes.

Since it appears that the influences of the re-deposition and the damage become further serious by narrowing the tracks in the future as described above, there is considered that it is effective to widely form the sensor film as disclosed in Patent Document 3. This is because the adverse effect of the re-deposition and the damage is effectively reduced when the sensor film is widened. However, the side reading from the track side is liable to occur as the sensor film is wider, and it seems that an improvement in the recording density due to the narrowed tracks is difficult.

Japanese Patent Document 4 discloses the characteristic deterioration prevention of the TMR head in the write head annealing process, but fails to disclose the characteristic deterioration prevention in etching the TMR film.

In the above-mentioned conventional art, the characteristic deterioration of the CPP type head is prevented by the re-deposition removal etching process of the sensor film, the sensor film end protection, or an enlargement in the sensor film. However, there is no specific disclosure as to the etching configuration of the sensor film. Also, the characteristic stabilization due to the domain control film is important, but a relationship with the end configuration of the sensor film is uncertain. In the future, it is estimated that diverse novel sensor films are developed in order to further increase the output. However, there is the possibility that a damage on the sensor film becomes remarkable due to the etching operation or the re-deposition removal.

A tendency is made that a material of the barrier layer in the TMR head changes from the conventional alumina to MgO. This is because the output can be further increased with the use of MgO. Under the circumstances, an MgO-TMR head manufacturing using the etching method including the re-deposition removal has been studied. FIG. 25 is a diagram showing the characteristic of the head that has been obtained through the conventional manufacturing method. FIG. 25 shows that the obtained head characteristic is normalized by the film characteristic with the use of a resistance-area product (RA) and the MR ratio (MR) which are indexes indicative of the CPP type head characteristics. The obtained head characteristics are remarkably deteriorated in the RA and the MR due to the characteristic of the film per se. Separately, the configuration has been observed, but the clear re-deposition has not been found. From that fact, it is estimated that the characteristic deterioration is caused by the influence of the damage due to the re-deposition removing process. It is estimated that the damage is the metallization due to an oxide defect from the barrier layer or the mixing of the barrier layer and the magnetic layer together.

BRIEF SUMMARY OF THE INVENTION

Embodiments of the present invention help to prevent a head characteristic from being deteriorated by re-deposition or damage which occurs when a sensor film is etched, a track width is narrowed, and the head characteristic is stabilized. According to one embodiment, when it is assumed that the thickness of the sensor film on an air bearing surface is T, and a distance between an end of a medium layer that is interposed between a free layer and a pinned layer which comprise the sensor film and an end of the sensor film lowest portion, a relationship of $1.2 \times T \leq X \leq 2.5 \times T$ is satisfied, and the ends of a pair of magnetic films which are in contact with both sides in the track-width direction through an insulator do not exist in the track central portion from the free layer end. The sensor film is etched while an incident angle of an etching beam is changed over, and when it is assumed that a direction normal to the sensor film surface is the incident angle of 0, etching is conducted under the condition where the incident angle of the etching beam becomes smaller with time.

BRIEF DESCRIPTION OF THE DRAWINGS

FIGS. 5(a) and 5(b) are schematic diagrams showing a configuration used in the calculation of a magnetic field.

FIGS. 6(a) and 6(b) are schematic diagrams showing a configuration used in the calculation of a magnetic field.

FIGS. 14(a) and 14(b) are explanatory diagrams showing a relationship between an incident angle and the width of the damaged layer.

FIGS. 18(a) and 18(b) are diagrams showing an air bearing surface configuration of the magnetic head.

FIGS. 20(a) and 20(b) are diagrams showing the beam incident angle dependency and the track width dependency of the read head characteristic.

DETAILED DESCRIPTION OF THE INVENTION

Figure 1:
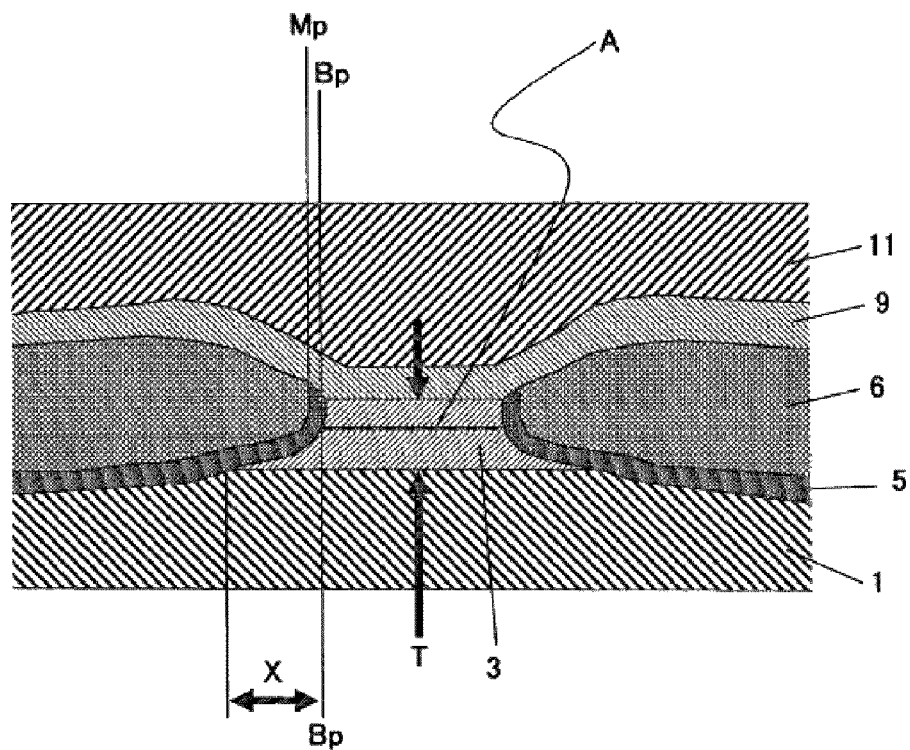
FIG. 1 is a diagram showing a read head according to an embodiment of the present invention.

Embodiments of the present invention relate to a thin film magnetic head for use in a magnetic disc storage and a method of manufacturing the same, and more particularly relate to a thin film magnetic head for reading.

Embodiments of the present invention have been made in view of the above issues with the above conventional art, and therefore an object of embodiments of the present invention is to provide a thin film magnetic head which is capable of reducing the re-deposition onto the sensor film or a damage of the sensor film, and stabilizing the head characteristic even with a narrowed track width.

A CPP type magnetic head according to embodiments of the present invention includes a sensor film, a pair of upper shield and lower shield which are disposed in the thickness direction of the sensor film and also serve as electrodes for allowing a current to flow, and a pair of magnetic films that come in contact with both sides of the sensor film in a track-width direction through an insulator. When it is assumed that the thickness of the sensor film is T, and a distance between an end of a medium layer that is interposed between a free layer and a pinned layer which constitute the sensor film and an end of the lowest portion of the sensor film is X, a relationship of $1.2 \times T \leq X$, preferably $1.2 \times T \leq X \leq 2.5 \times T$ is satisfied. The pair of magnetic films is formed at the outer side of the cross-track displacement of the free layer. That is, the positional relationship between the pair of magnetic films and the free layer in the track-width direction has a relationship that the magnetic film end does not exist in the track central portion from the end of the free layer.

Also, it is possible that the surface configuration of the sensor film in the track-width direction has a skirt configuration that changes with a gentle curve, and the lower shield is recessed (over-etched) from the end of the sensor film lowest portion. It is preferable that the sensor film upper portion has a configuration perpendicular to the film surface (about 90°±5), and the vicinity of the medium layer has an angle of about 70° to 90° with respect to the film surface.

In a method of manufacturing the thin film magnetic head, when the sensor film is etched while the incident angle of the etching beam is changed over, and a direction normal to the sensor film surface is an incident angle 0, the etching operation is conducted under the condition where the incident angle of the etching beam becomes smaller with time. The incident angle that is first used is set to 40° to 50°, and the incident angle that is finally used is set to 20° to 30°. Also, the sensor film is etched up to the lowest layer of the sensor film, and the lower shield layer that is disposed below the sensor film is partially over-etched.

According to embodiments of the present invention, there can be obtained the CPP type magnetic head that is stable in the characteristic with the narrowed track width, which prevents the characteristic from being deteriorated by the re-deposition or the damage.

Hereinafter, embodiments of the present invention will be described. As usual, the thin film magnetic head according to embodiments of the present invention is used in a read head, and used in combination with a write head. The write head portion is omitted, and only the read head portion will be described so far as there is no specific description.

FIG. 1 is a diagram showing a magnetic head according to one embodiment of the present invention, and a diagram showing a air bearing surface configuration in the vicinity of a sensor film. The magnetic head includes a lower shield 1, a sensor film 3, an insulator 5, a magnetic film 6, an upper gap film 9, and an upper shield 11. The sensor film 3 is formed of a multilayer film including at least a free layer, a pinned layer, and a medium layer that is disposed between the free layer and the pinned layer. A hard magnetic film is used as the magnetic film 6, and a magnetic field is applied to the sensor film 3 in a track-width direction to stabilize the characteristic of the free layer. Reference T denotes the thickness of the sensor film 3, Bp is an end of a medium layer A, and X is a width between the end Bp of the medium layer A and the lowest end of the sensor film 3.

Figure 2:
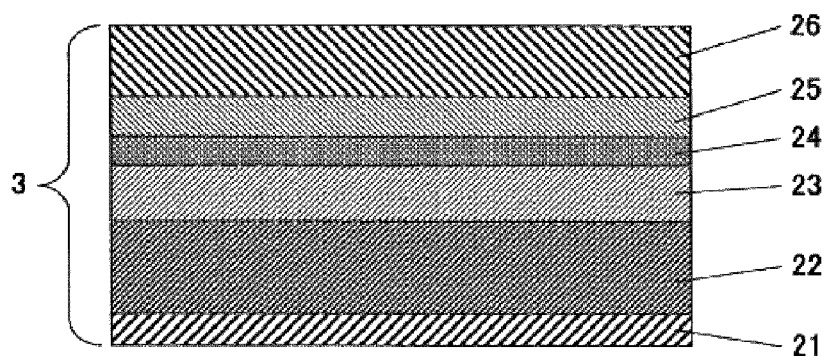
FIG. 2 is a diagram showing an example of a CPP type sensor film structure.

FIG. 2 shows an example of the sensor film configuration. The sensor film 3 is made up of a seed layer 21, an antiferromagnetic layer 22, a pinned layer 23, a medium layer 24, a free layer 25, and a capping layer 26. In the case of the TMR film, a tunneling barrier layer (barrier layer) is disposed in the medium layer 24. An oxide film made of alumina or MgO is used as the barrier layer.

The sensor wall surface configuration shown in FIG. 1 which is an example of one embodiment of the present invention, has a skirt configuration that a sensor film upper portion is of a substantially perpendicular configuration, and a wall surface angle gently changes from the sensor film upper portion. That the sensor film upper portion is substantially perpendicular means that it is advantageous in narrowing the tracks, and a dimensional precision is improved. The sensor configuration disclosed in Patent Document 4 has a linear configuration that spreads from the sensor film upper portion toward the lower portion. In the case of the above configuration, the width in the vicinity of the free layer and the barrier layer which define the track width is liable to be expanded in the track-width direction. The track width is widened because the wall surface inclination of the sensor film upper portion is gentle, and the wall surface is linear. In order to provide the narrowed track width, it is necessary to narrow the track width due to the photolithography that forms an etching mask, and there is a fear that a dimensional variation occurs with narrowing of the track width. As a result, there is the possibility that a precision in the dimensions is deteriorated. According to embodiments of the present invention, because the sensor film upper portion is substantially perpendicular, it is difficult to enlarge the width in the vicinity of the free layer and the barrier layer which define the track width in the track-width direction. That is, the dimensional shift is small as compared with the width of the sensor film upper portion. In other words, because the dimensional shift with respect to the etching mask can be reduced, it is unnecessary to narrow the track width through the photolithography as much, thereby making it possible to prevent the dimensional accuracy from being deteriorated.

In addition, according to embodiments of the present invention, the sensor film lower portion has a spreading configuration, to thereby make it possible to stabilize the characteristic. For example, in the case where the etching wall surface is formed by only the perpendicular surface, it appears that the precision in the dimension is improved. However, there is a fear that the characteristic is varied with the narrowed track width. This means that the volumes of the pinned layer and the antiferromagnetic layer which are arranged on the sensor film lower portion are reduced more as the track width is made narrower. The pinned layer and the antiferromagnetic layer have magnetizations that are fixed unidirectionally, but the magnetizations become unstable when the volume is reduced. According to embodiments of the present invention, the sensor film lower portion has the spread configuration, thereby making it possible to increase the volumes of the pinned layer and the antiferromagnetic layer more than those described above. As a result, it is possible to improve the stabilities of the pinned layer and the antiferromagnetic layer.

Also, embodiments of the present invention have a skirt configuration that the wall surface angle gently changes, to thereby make it possible to excellently form the insulator 5 and the magnetic film 6 which will be arranged later. In the case of the wall surface configuration having a rapid angle change, a change in the film thickness and a change in the crystalline are liable to occur at portions where the angle changes in the insulator 5 and the magnetic film 6. As a result, the isolation voltage of the insulator 5 is deteriorated, and the characteristic of the magnetic film 6 is deteriorated.

In addition, according to embodiments of the present invention, the wall surface configuration of the sensor film changes with the tendency of a recess configuration. This configuration has another effect. The provision of the tendency of the recess configuration enables the volume in the vicinity of the sensor film 3 of the magnetic film 6 to increase as compared with the linearly inclined wall surface. In the case where a domain control film is arranged as the magnetic film 6, that a larger number of domain control films can be arranged in the vicinity of the sensor film 3 means that the effect of the domain control films can be more improved. As a result, the stability of the free layer 25 within the sensor film 3 is improved, and the characteristic stability is improved. According to embodiments of the present invention, it is preferable that at least the antiferromagnetic layer 22 of the sensor film 3 has the tendency that the wall surface configuration of the sensor film is the recess configuration. This is because at least the antiferromagnetic layer 22 of the sensor film 3 has the tendency that the wall surface configuration is the recess configuration, thereby making it easy to arrange a larger number of magnetic films 6 in the vicinity of the free layer 25.

It is preferable that the angle of the sensor film upper portion is about the perpendicular configuration (90°)±5°. When the sensor film upper portion is more inclined, there is a fear that the track width is enlarged, the dimensional precision is deteriorated, or the configuration of the insulator 5 or the magnetic film 6 is defective. Also, it is preferable that the angle of the sensor film side surface in the vicinity of the medium layer is about 70 to 90°. When the sensor film side surface is more inclined, there is a fear that the track width is enlarged, and the dimensional precision is deteriorated. Also, the skirt degree of the wall surface configuration, and the positional relationship between the magnetic film 6 and the sensor film are optimized, thereby making it possible to perform both of the deterioration of the characteristic deterioration and an improvement in the characteristic.

Figure 3:
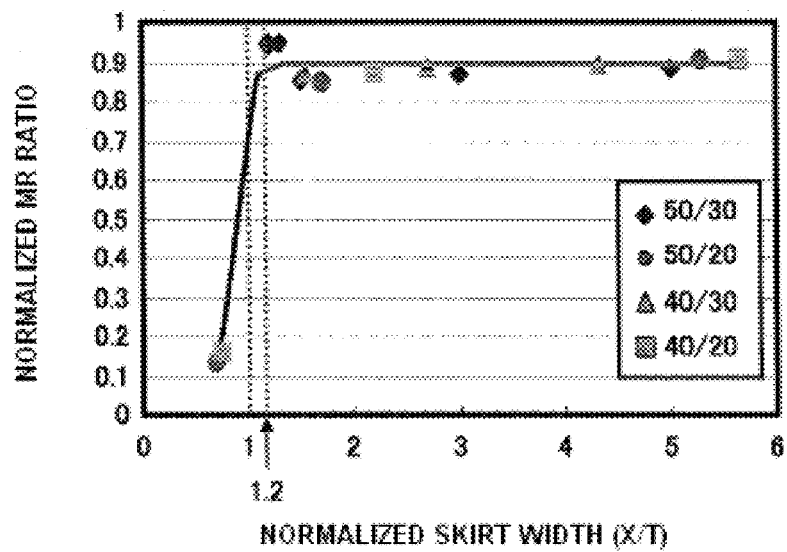
FIG. 3 is a diagram showing a relationship between a skirt width and an MR characteristic of a sensor film.

FIG. 3 is a diagram showing a relationship between the skirt width of the sensor film and the MR characteristic. The X axis represents a value (hereinafter referred to as "normalized skirt width") obtained by dividing X that is a width of the skirt between the medium layer end Bp and the lowest portion end of the sensor film 3 shown in FIG. 1 by the sensor film thickness T (hereinafter referred to as "normalized skirt width"). The Y axis is obtained by experimentally producing the thin film magnetic head shown in FIG. 1 and normalizing the obtained MR characteristic (MR ratio) by the MR characteristic of the sensor film per se (hereinafter referred to as "normalized MR ratio"). As the sensor film 3, there is used an MgO-TMR film having the same medium layer made of MgO (functions as the barrier layer) as that in FIG. 1.

Figure 24:
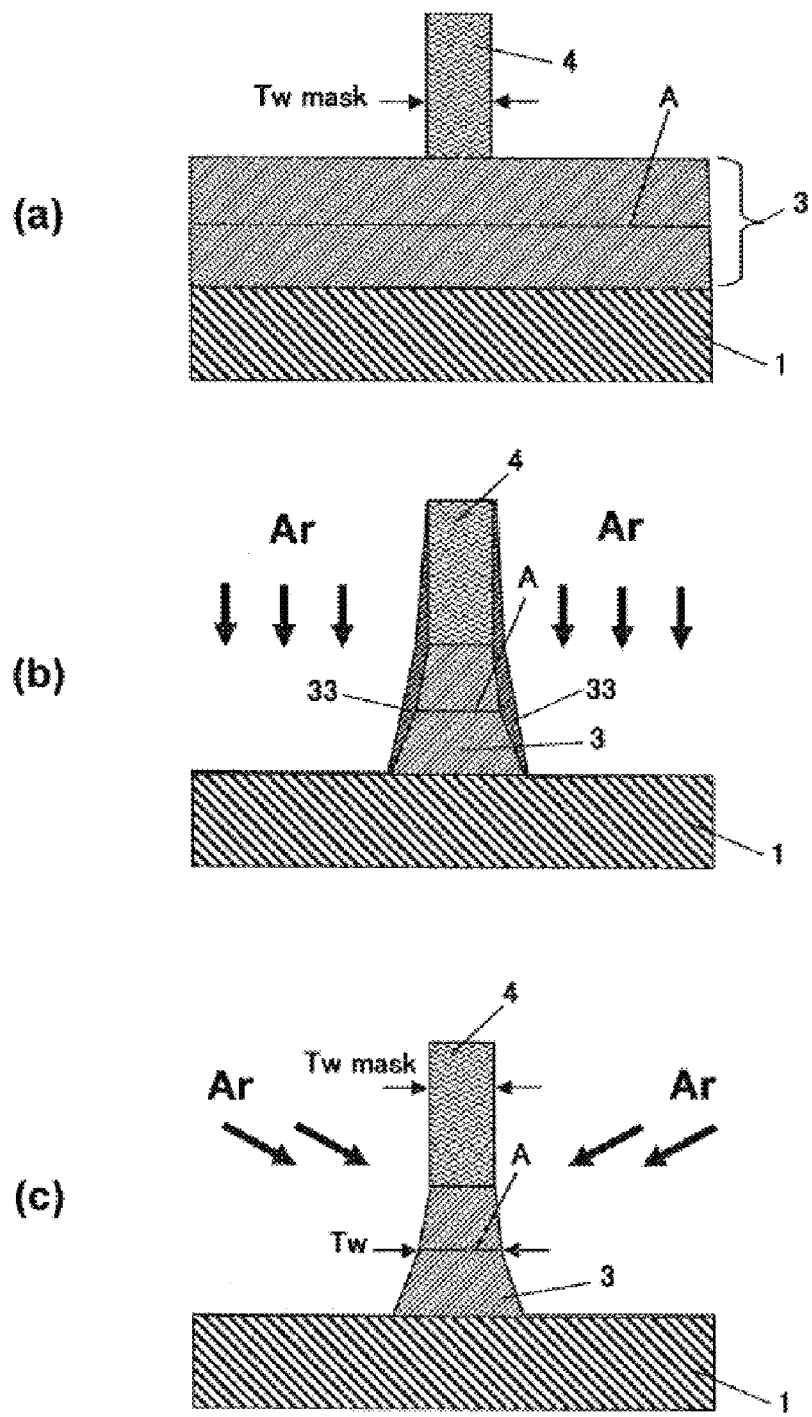
FIGS. 24(a)-24(c) are diagrams showing a conventional manufacturing method.
Figure 25:
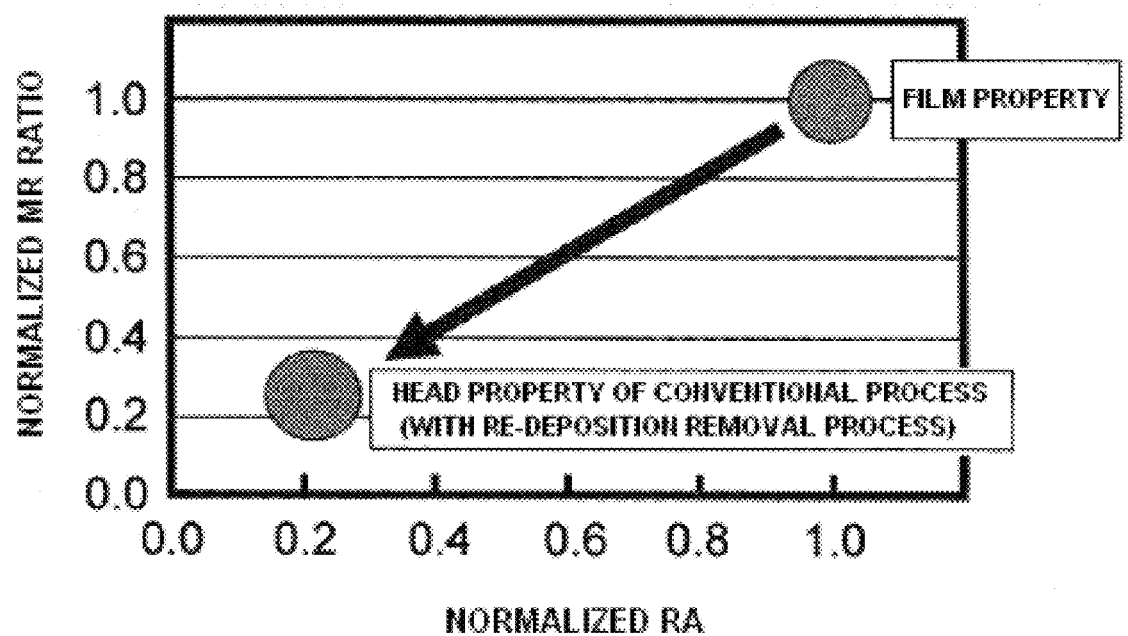
FIG. 25 is a diagram showing the characteristic of a head that is obtained according to a conventional manufacturing method.

In order to change the etching configuration, diverse etching conditions are used. Data that is roughly classified into four kinds is described here, which will be described in more detail with reference to the manufacturing method later. In a first series, a first beam incident angle is set to 50°, the incident angle is changed over in the medium layer, and the sensor film lower portion is etched at the beam incident angle 20°. In a second series, the first beam incident angle is set to 50°, the incident angle is changed over in the medium layer, and the sensor film lower portion is etched at the beam incident angle 30°. In a third series, the first beam incident angle is set to 40°, the incident angle is changed over in the medium layer, and the sensor film lower portion is etched at the beam incident angle 20°. In a forth series, the first beam incident angle is set to 40°, the incident angle is changed over in the medium layer, and the sensor film lower portion is etched at the beam incident angle 30°. The reason that the normalized skirt width is changed under the same etching conditions is because the over-etching of the lower shield is changed under those respective etching conditions to change the configuration. The over-etching quantity is changed to about 0 nm to 12 nm. The reason that the skirt width of the sensor film is taken as the X axis is because it is presumed that the re-deposition during etching of the sensor film greatly depends on the configuration. In fact, as is apparent from FIG. 3, the normalized MR is excellent when the normalized skirt width (X/T) is 1.2 or more, but is rapidly deteriorated when the normalized skirt width (X/T) is about 1. In other words, the MR characteristic greatly depends on the sensor film configuration of the sensor film end. That the normalized skirt width (X/T) is small means that the inclination of the wall surface of the etched sensor film is significantly steep. When the inclination of the etched wall surface becomes steep, the re-deposition is more readily formed with the result that the characteristic is deteriorated. In the case where the formed re-deposition is removed by the conventional art shown in FIG. 24, even if the re-deposition is removed, the characteristic is not restored because of the damage. This is identical with that described above with reference to FIG. 25.

Figure 4:
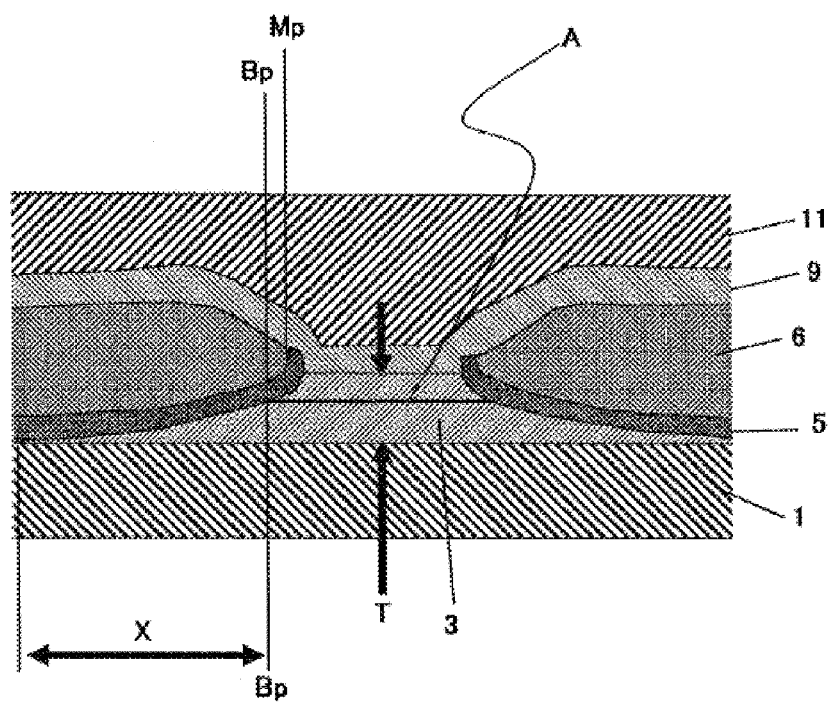
FIG. 4 is a diagram showing an example of a head in which the inclination of a wall surface of a sensor film is gentle.

On the other hand, when the normalized skirt width (X/T) increases, the inclination of the wall surface of the etched sensor film becomes gentle. An example of the configuration is shown in FIG. 4. In the case of the configuration shown in FIG. 4, no re-deposition is formed on MgO. However, the inclination angles of the wall surface in the vicinity of the medium layer A and the sensor film upper portion are liable to be gentle with the increased normalized skirt width. For that reason, there is a fear that it is difficult to form the narrowed track width, and the dimensional precision is deteriorated. In addition, there is a fear that the effect of the magnetic film 6 that is arranged laterally in the vicinity of the sensor film 3 is deteriorated. This will be described below.

The read head is required to prevent the re-deposition and the damage to ensure the output, and to stabilize the head characteristic. In order to achieve the above requirements, it is important that a unidirectional magnetic field effectively works in the track-width direction due to the magnetic film (domain control film) 6 shown in FIG. 1. More specifically, this is the stable operation of the free layer included in the sensor film 3. In particular, the free layer end becomes unstable in the operation because of the demagnetization field. That is, the intensity of the unidirectional magnetic field in the track-width direction due to the magnetic film (domain control film) 6 is more required toward the free layer end. The magnetic field is calculated through the finite element method taking the positional relationship of the sensor film and the magnetic film (domain control film) 6 into consideration. The magnetic field calculation will be described with reference to FIGS. 5 to 8.

Figure 7:
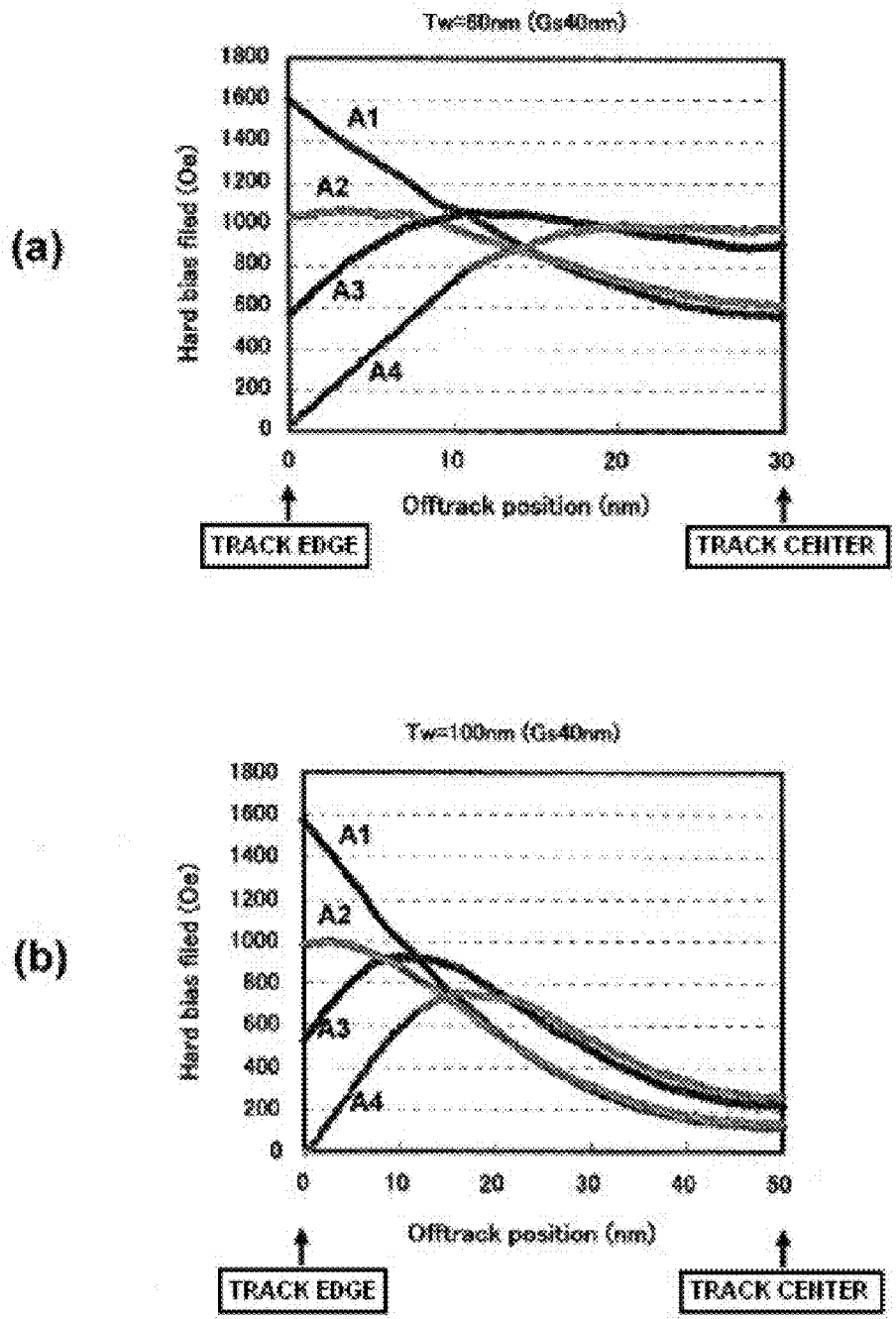
FIGS. 7(a) and 7(b) are diagrams showing the results of the magnetic field calculation.
Figure 8:
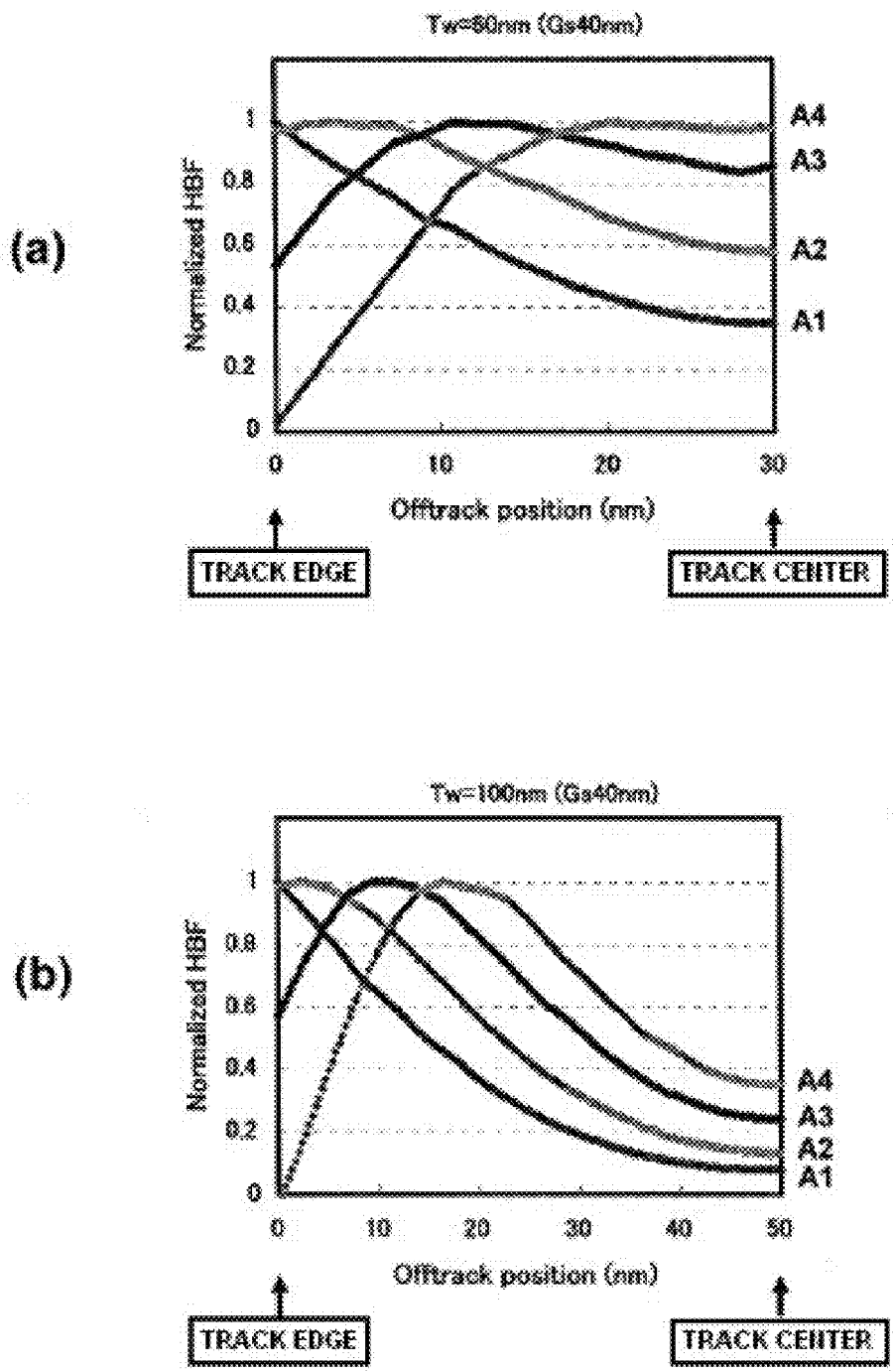
FIGS. 8(a) and 8(b) are diagrams showing the results of the magnetic field calculation.

FIGS. 5 and 6 show the configuration model used in the magnetic field calculation. Those figures show an air bearing surface configuration in the vicinity of the sensor film, and show only the left side region. Reference A (A1 to A4) shows MgO that is a medium layer. Reference C is a track central portion. Reference Bp is an MgO end, which is an end that is substantially equal to the free layer end and defines the track width (because the free layer comes in contact with MgO, the width of the free layer that comes in contact with MgO is substantially equal to the width of MgO). Reference Mp is an end position of the magnetic film (domain control film) 6. Reference X is a width between the end Bp of the medium layer and the lowest portion end of the sensor film 3. Because the free layer is in contact with MgO, a magnetic field distribution from the magnetic film 6 which is applied to the free layer is substantially equal to the magnetic field distribution from the magnetic film 6 which is applied to MgO. Under the circumstances, the magnetic field intensity in the track-width direction which is developed by the magnetic film 6 in A of FIGS. 5 and 6 is obtained by the magnetic field calculation. In this case, air is disposed in the sensor film region shown in the figures, and the magnetic film 6, the lower shield, and the upper shield are arranged to calculate the magnetic field intensity at A. The results are shown in FIGS. 7 and 8.

First, FIG. 7 will be described. The axis of abscissa in the figure represents the position in the track-width direction, in which the right end of the axis represents the track central portion, and the left end of the axis represents the track end. The axis of ordinate represents the magnetic field intensity at the respective positions in the track-width direction at A. FIG. 7(a) is the calculation results in the case where the track width is 60 nm, and FIG. 7(b) is the calculation results in the case where the track width is 100 nm. A distance between the upper and lower shields in the vicinity of the sensor film 3 is se to 40 nm. The results of FIG. 7(a) are the largest as the magnetic field intensity of the track end in the case of A1 shown in FIG. 5(a), and the smallest in the case of A4 shown in FIG. 6(b). A1 and A2 have a tendency to gradually increase the magnetic field intensity from the track central portion toward the track end, and are preferable in order to improve the stability. On the other hand, A3 and A4 have a tendency to slightly increase the magnetic field intensity toward the track end, but the magnetic field intensity is decreased at the track end. This suggests that the magnetic field intensity from the domain control film is weakened at the track end that most requires the stability, and the head operation becomes unstable. FIG. 7(b) also has the same tendency, and the magnetic field intensity from the domain control film is remarkably deteriorated at the track end in A3 and A4. That is, the above tendency does not depend on the track width.

FIGS. 8(a) and 8(b) show FIGS. 7(a) and 7(b) normalized by the largest magnetic field intensity (Normalized Hard Bias Field: normalized HBF). Likewise, in FIGS. 8(a) and 8(b), the normalized HBF is remarkably deteriorated at the track end in A3 and A4.

Figure 9:
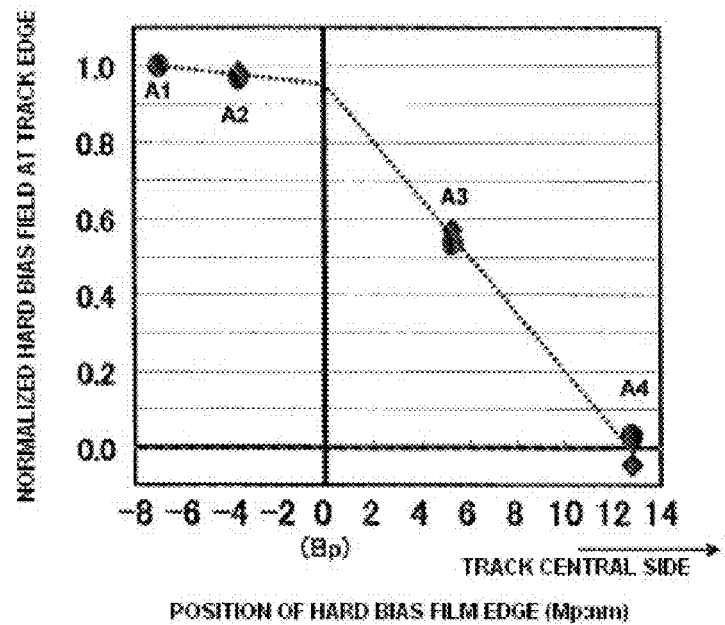
FIG. 9 is a diagram showing a relationship between the results of the magnetic field calculation and the configuration.

Only the magnetic field intensity at the medium layer A is described above. However, when the calculation results are analyzed, it is found that a tendency is made that the magnetic field at the domain control film end is the largest. That is, the positional relationship between the leading position of the domain control film and the sensor film is important. FIG. 9 shows the normalized HBF of the sensor film end by the positional relationship between the domain control film and the sensor film. The axis of abscissa represents the relationship of the end position Mp of the magnetic film (domain control film) 6 from the MgO end Bp. The plus (+) direction in the axis of abscissa is the track central side, and the minus (−) direction means the track exterior. It is found from FIG. 9 that the end position Mp of the magnetic film 6 has a disproportionate curvature point in the vicinity of the MgO end Bp as the normalized HBF of the track end. That is, in order to make the domain control film effectively function at the track end, the end position Mp of the magnetic film 6 is not disposed at the track central portion from the MgO end Bp. In other words, it is important that the end position Mp of the magnetic film 6 does not exist in the track central portion from the free layer end.

Figure 10:
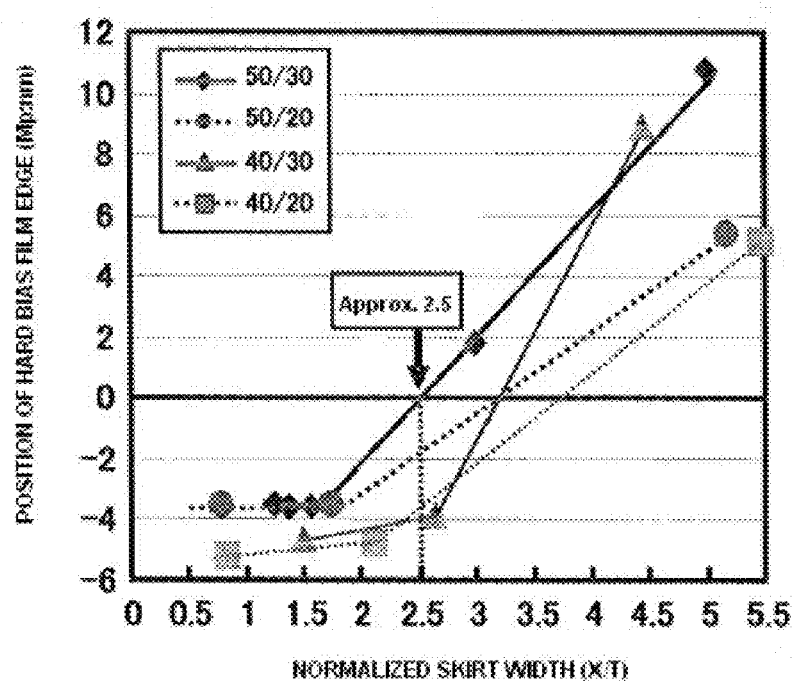
FIG. 10 is a diagram showing a relationship between a normalized skirt width and an end position of a domain control film.

FIG. 10 shows a relationship of the normalized skirt width and the end position of the domain control film on the basis of the embodiments of the present invention in FIGS. 1 and 4, and organizes the configurations formed under the experimental conditions described with reference to FIG. 3. It is found that even in the case where the experimental conditions are changed, the end position of the domain control film is moved toward the track central side more as the normalized skirt width is larger. Although the relationship between the end position of the domain control film and the normalized skirt width slightly depends on the experimental conditions, the end position of the domain control film does not protrude from the end of the medium layer (free layer) toward the central side of the sensor film in the track-width direction. That is, from the viewpoints of the stabilization of the configuration and the manufacturing method, it is preferable that the normalized skirt width that can establish the end position Mp of the magnetic film 6 with the relationship shown in FIG. 9 is 2.5 or lower.

Hence, in order to maintain the characteristic and ensure the stability of the sensor film due to the magnetic film 6, when it is assumed that the thickness of the sensor film is T, the distance between the end of the medium layer that is interposed between the free layer and the pinned layer which constitute the sensor film and the end of the sensor film lowest portion is X, the following relationships are important. That is, a relationship of $1.2 \times T \leq X$ is satisfied. Also, as the positional relationship of the pair of magnetic films (domain control films) 6 and the free layer which come in contact with each other through the insulator at both sides of the track-width direction in the track-width direction, it is important to satisfy a relationship that the end of the magnetic film 6 does not exist in the central portion in the track-width direction from the end of the free layer (as other words of the positional relationship, a relationship that the end of the magnetic film 6 does not exist in the central portion of the sensor film in the track-width direction beyond the end of the medium layer is satisfied). In order to more stably form the end position of the magnetic film (domain control film) according to the sensor film configuration, it is more preferable to satisfy a relationship of $1.2 \times T \leq X \leq 2.5 \times T$.

Subsequently, a description will be given of a method of manufacturing the magnetic head according to embodiments of the present invention. As described with reference to FIGS. 24 and 25, it is difficult to apply the conventional manufacturing method including the re-deposition removing process to the sensor film that is sensitive to damage.

Figure 11:
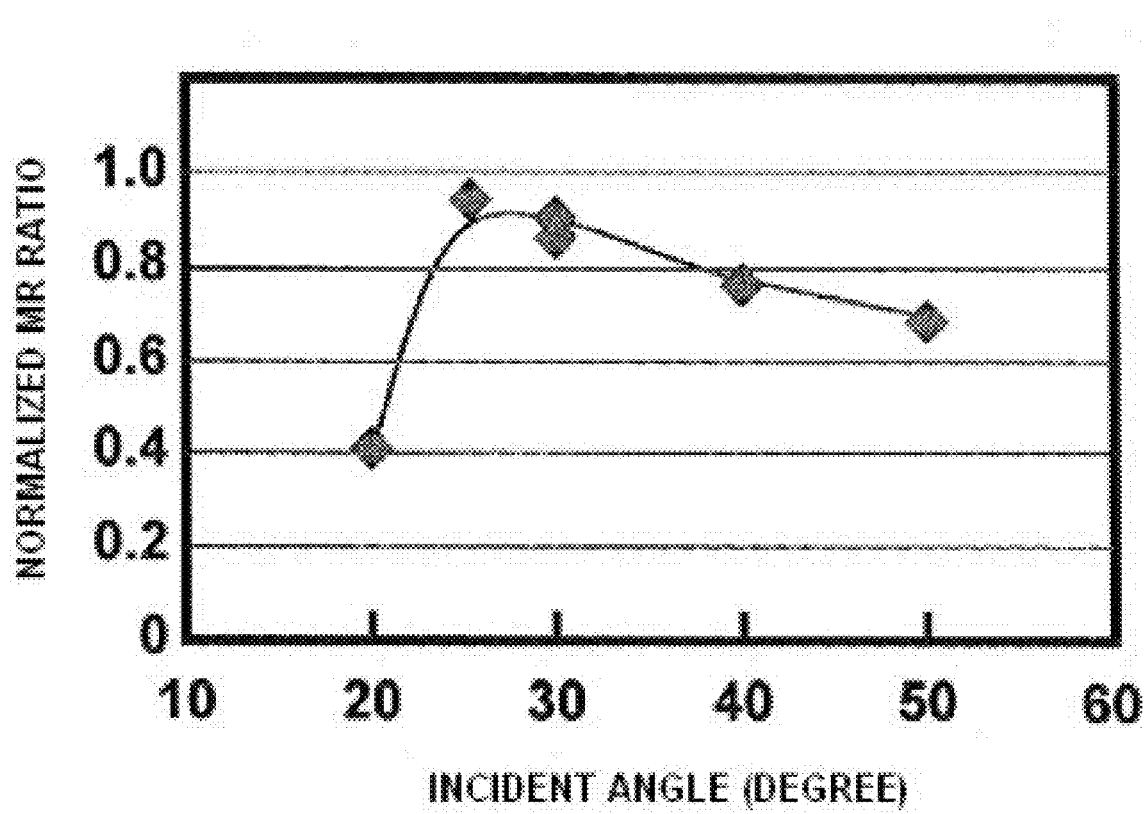
FIG. 11 is a diagram showing the characteristic of an MgO-TMR head that is experimentally produced while changing etching conditions.

Under the circumstances, an etching process having no re-deposition removing process due to the incident angle as in the conventional art is experimentally conducted. The characteristics of the MgO-TMR head that has been experimentally produced while changing the etching conditions are shown in FIG. 11. FIG. 11 shows the evaluated characteristics of the head that has been manufactured by etching the sensor film while the incident angle is kept constant in a range of 20 to 50°. As shown in the figure, the characteristics are remarkably deteriorated when the sensor film has been etched at the incident angle of 20°. However, the characteristics are recovered up to substantially the film characteristic by etching the sensor film at the incident angle of about 25° to 30°, and again deteriorated when the incident angle is again increased to 40° to 50°. Those TMR head configurations are evaluated. As a result, it is confirmed that the re-deposition is made on the barrier layer wall surface at the incident angle of 20°. It is estimated that the re-deposition causes short circuit which remarkably deteriorates the characteristics. It is estimated that the deterioration at the incident angle of 40° to 50° is caused by the damage to the sensor film because no re-deposition is found. It is presumed that the damage to the sensor film is also greatly associated with the incident angle, and also greatly associated with an actual incident angle with respect to the wall surface of the sensor film.

Also, the characteristics are greatly recovered at the incident angle of about 30°, but it is found that the re-deposition is formed on the upper portion of the sensor film. In order to ensure a margin of the re-deposition, it is preferable that the re-deposition is not formed on the upper portion of the sensor film as much as possible.

It is also important to respond to the narrowed track width. More specifically, a width in the vicinity of the barrier layer after being etched is not largely widened with respect to the width Tw mask of a track forming resist mask (etching mask) 4 as shown in FIG. 24(a). Specifically, the width in the vicinity of the barrier layer is directed to the width of the magnetic layer (free layer) that comes in contact with the barrier layer, and responds to a medium magnetic field. The width of the free layer defines the actual track width (Tw). When the free layer width is larger than the etching mask width, it is necessary to further narrow the etching mask in order to obtain a desired narrowed track width. Taking the dimensional precision and the yield into consideration, it is desirable to reduce the dimensional shift with respect to the width Tw mask of the track forming resist mask 4 as much as possible. That the re-deposition is formed on the upper portion of the sensor film as described above means that the dimensions are increased as much. Hence, it is difficult to perform the narrowed track width and the reduction in the re-deposition and the damage in the single etching step. On the other hand, the process including the re-deposition removing step at the incident angle of 70° has a fear that the sensor film is damaged.

Figure 12:
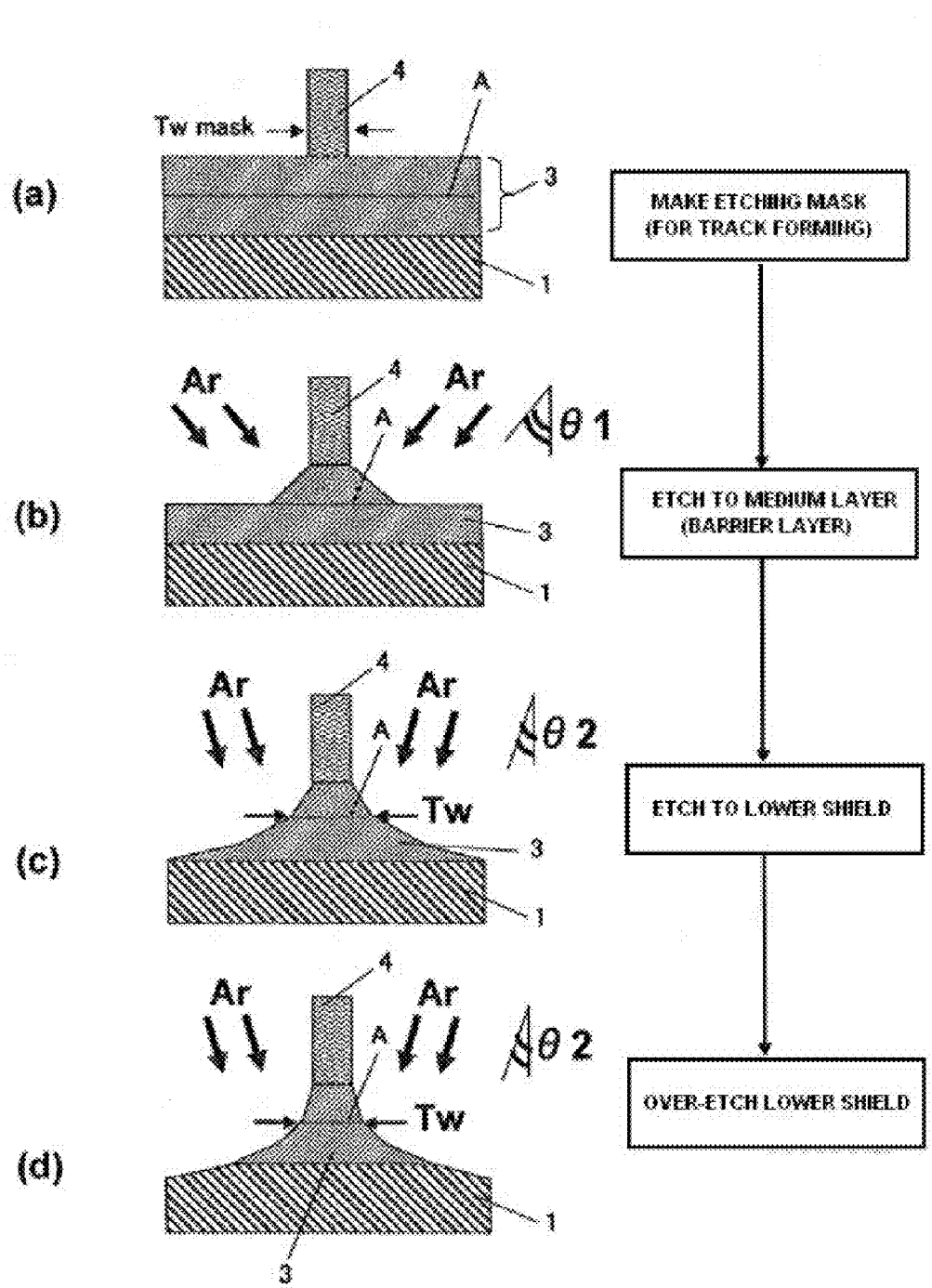
FIGS. 12(a)-12(d) are diagrams showing an example of a method of manufacturing a read head according to an embodiment of the present invention.

A magnetic head manufacturing method according to an embodiment of the present invention is shown in FIG. 12. FIG. 12 is a process diagram showing the vicinity of the sensor film on the air bearing surface of the CPP type thin film magnetic head, and a flowchart. As shown in FIG. 12(a), the sensor film 3 is formed on the lower shield 1 that is an electrode, and the track forming resist mask 4 is formed on the sensor film 3. In the figure, reference A denotes a position of the medium layer in the sensor film. As shown in FIG. 12(b), the etching beam is input to the sensor film 3 at an incident angle $\theta 1$, and the sensor film 3 is etched partway. When the incident film 3 is etched, the elements of the film to be etched are monitored by an analysis device such as SIMS. Specifically, since MgO is now used as the medium layer, Mg is detected, and the sensor film 3 is etched up to MgO at the incident angle of $\theta 1$. In this example, an Ar ion milling device is used as the etching device. An inert gas such as Ar is used as the etching gas, but it is possible to use a reactive ion-milling device using a reactive gas such as fluorine series or chlorine series, or the mixture of those gases. An analysis device other than SIMS can be used as the etching monitoring means. Also, the incident angle is changed over by the medium layer (MgO), but it is possible to arbitrarily change over the incident angle by another layer while monitoring the etching operation. Then, as shown in FIG. 12(c), the etching beam is input to the sensor film 3 at an incident angle $\theta 2$, and the sensor film 3 is further etched. The incident angle $\theta 2$ is smaller than the incident angle $\theta 1$. FIG. 12(d) shows a case in which the etching operation is further added at the incident angle of $\theta 2$, and the lower shield 1 is slightly etched (over-etched).

It may be preferable that the first incident angle $\theta 1$ shown in FIG. 12(b) is inclined at 40° or higher. This is because it is difficult to form the re-deposition on the sensor film wall surface in that incident angle region. That is, short circuit due to the re-deposition can be prevented by an inclination of 40° or higher. However, as shown in FIG. 11, the characteristic deterioration caused by a factor other than the re-deposition, that is, the deterioration caused by the damage occurs at the incident angle of 40° or higher. When it is assumed that a region having damage is a damaged layer, it is estimated that the width of the damaged layer is larger as the skirt width of the sensor film wall surface is larger.

Figure 13:
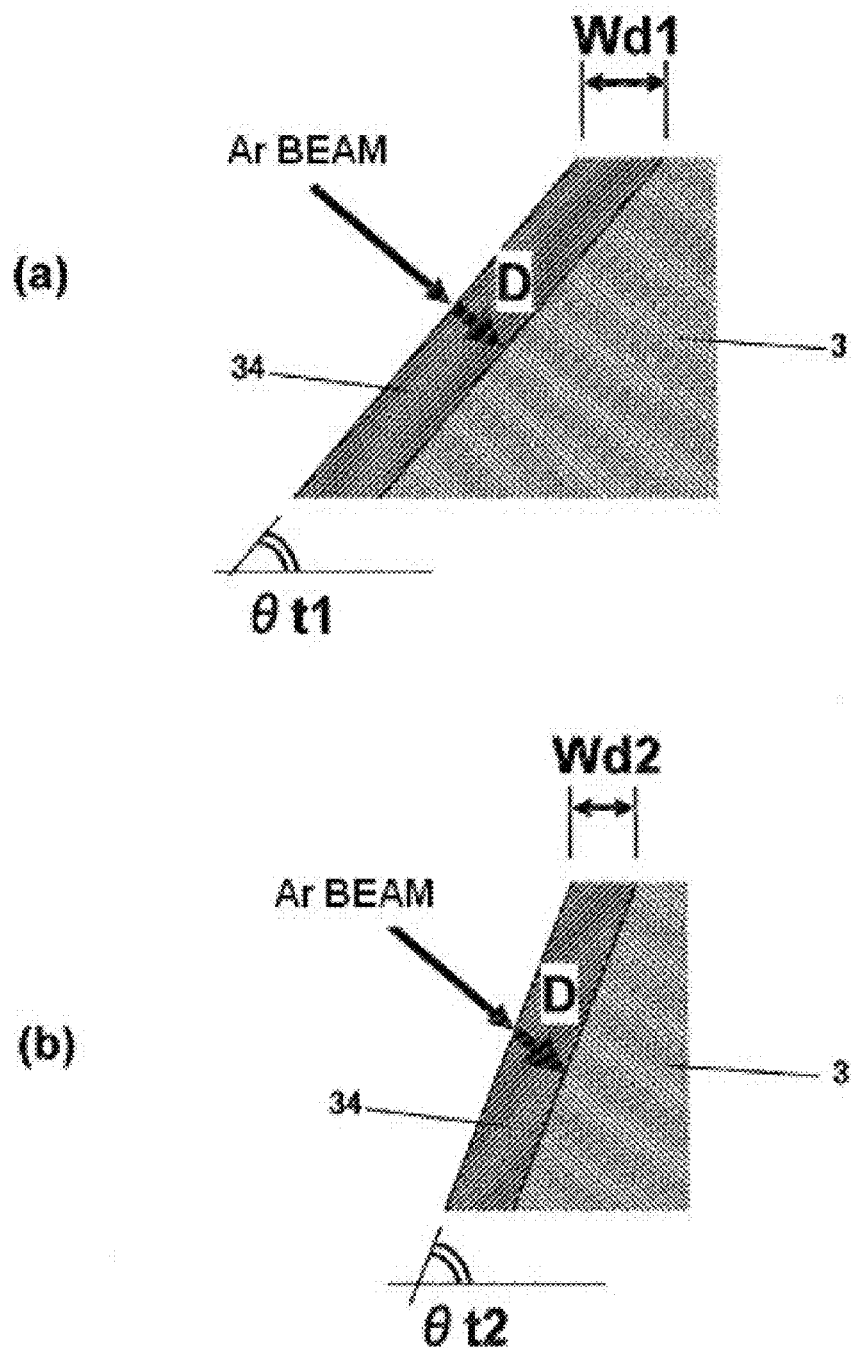
FIGS. 13(a) and 13(b) are explanatory diagrams showing a relationship between the skirt width of the sensor film and the width of the damaged layer.

A relationship between the skirt width of the sensor film and the width of the damaged layer will be described with reference to a schematic diagram of FIG. 13. FIG. 13(a) is a schematic diagram in the case where the skirt width of the sensor film is larger, and FIG. 13(b) is a schematic diagram in the case where the skirt width is smaller. In FIG. 13(a), it is assumed that the etching beam is input to the sensor film, and the interior of the sensor film is damaged by a distance D. In this case, the damage width of the sensor width is Wd1. On the other hand, in FIG. 13(b), the damage width is Wd2. When it is assumed that the interior of the sensor film is damaged by the distance D in the same manner in FIGS. 13(a) and 13(b), Wd1>Wd2 is satisfied. The same is applied to a case in which the incident angle is changed in the skirt of the same sensor film wall surface. A relationship between the incident angle and the width of the damage layer is shown in a schematic diagram of FIG. 14, and will be described. FIG. 14(a) is a schematic diagram in the case where the incident angle is smaller, and FIG. 14(b) is a schematic diagram in the case where the incident angle is larger. In FIG. 14, it is assumed that the etching beam is input to the sensor film, and the interior of the sensor film is damaged by the distance D in the same manner as that in FIG. 13. In this case, the width of the damaged layer satisfies Wd3<Wd4. It is presumed that the characteristics are more deteriorated as the incident angle is larger due to those causes although the re-deposition is not found at the incident angle of 30° or higher shown in FIG. 11.

It is preferable that the final incident angle $\theta$ shown in FIG. 12(c) is 20 to 30°. The etching operation is conducted under the condition where the incident angle $\theta 1$ is smaller than the above incident angle $\theta 2$, thereby making it possible to remove or reduce the damaged layer that has been formed on the sensor film in the process of FIG. 12(b).

It is possible to complete the etching operation in the state shown in FIG. 12(c). In addition, the lower shield 1 is over-etched as shown in FIG. 12(d), thereby making it possible to narrow the track width. This is because the over-etching operation is conducted to reduce the skirt width of the sensor film 3 more than that shown in FIG. 12(c) with the result that the track width is reduced more than that shown in FIG. 12(c). Hence, this configuration is capable of responding to the narrowed track. The over-etching operation allows the lower shield 1 to be scraped away into a configuration where an area in the track-width direction at the outside of the end of the sensor film lowest portion is continuous to a gentle curve configuration of the side surface of the sensor film in the track-width direction. The etching operation is conducted at the incident angle shown in FIG. 12(a), to thereby make it possible to prevent or reduce the formation of the re-deposition in an initial etching stage. As a result, it is possible to reduce the influence of a case in which the re-deposition is formed in the etching process including the over-etching operation in a later etching stage. In other words, the growth of the re-deposition is reduced as much as possible, to avoid a risk of the short circuit due to the re-deposition.

That is, according to embodiments of the present invention, the etching operation is conducted while preventing or reducing the re-deposition formation in the initial etching stage, to thereby enlarge the process margin of short circuit due to the re-deposition and also reduce the dimensional shift. In addition, the incident angle is decreased in the later etching stage, to thereby remove the damaged layer that has occurred in the initial etching stage, and narrow the track width.

Also, a weak oxidation treatment can be conducted on the wall surface of the sensor film 3 which has been etched. The damaged layer that has slightly remained to the degree that is difficult to analyze is subjected to the oxidation treatment, to thereby make it possible to improve the characteristic distribution. In the manufacturing method according to embodiments of the present invention, since the re-deposition is not thickly formed on the medium layer, it is satisfactory that the re-deposition per is subjected to a weak treatment than the re-deposition per se is oxidized. When strong oxidation is conducted such that the re-deposition per se is oxidized, there is conversely the possibility that the sensor film is damaged. Therefore, embodiments of the present invention is effective from this viewpoint.

When an attempt is made to narrow the track without using the manufacturing process of embodiments of the present invention, there is a proposal to narrow the track width together with the re-deposition removal. However, in this case, even if the narrowed track width can be realized, there is a fear that the characteristics are deteriorated by damaging the sensor film wall surface.

On the other hand, the etching operation at a single incident angle of 40° or higher shown in FIG. 11 makes it hard to extremely deteriorate the re-deposition. However, because the skirt width of the etching wall surface is large, the track width (Tw) dimensional shift with respect to the width Tw mask of the track forming resist mask 4 becomes large. Also, although the characteristic deterioration is small in the vicinity of the incident angle 30° shown in FIG. 11, the re-deposition is formed on the upper portion of the sensor film, thereby make the track width (Tw) of the sensor film wider than the width of the track forming resist mask 4.

Figure 15:
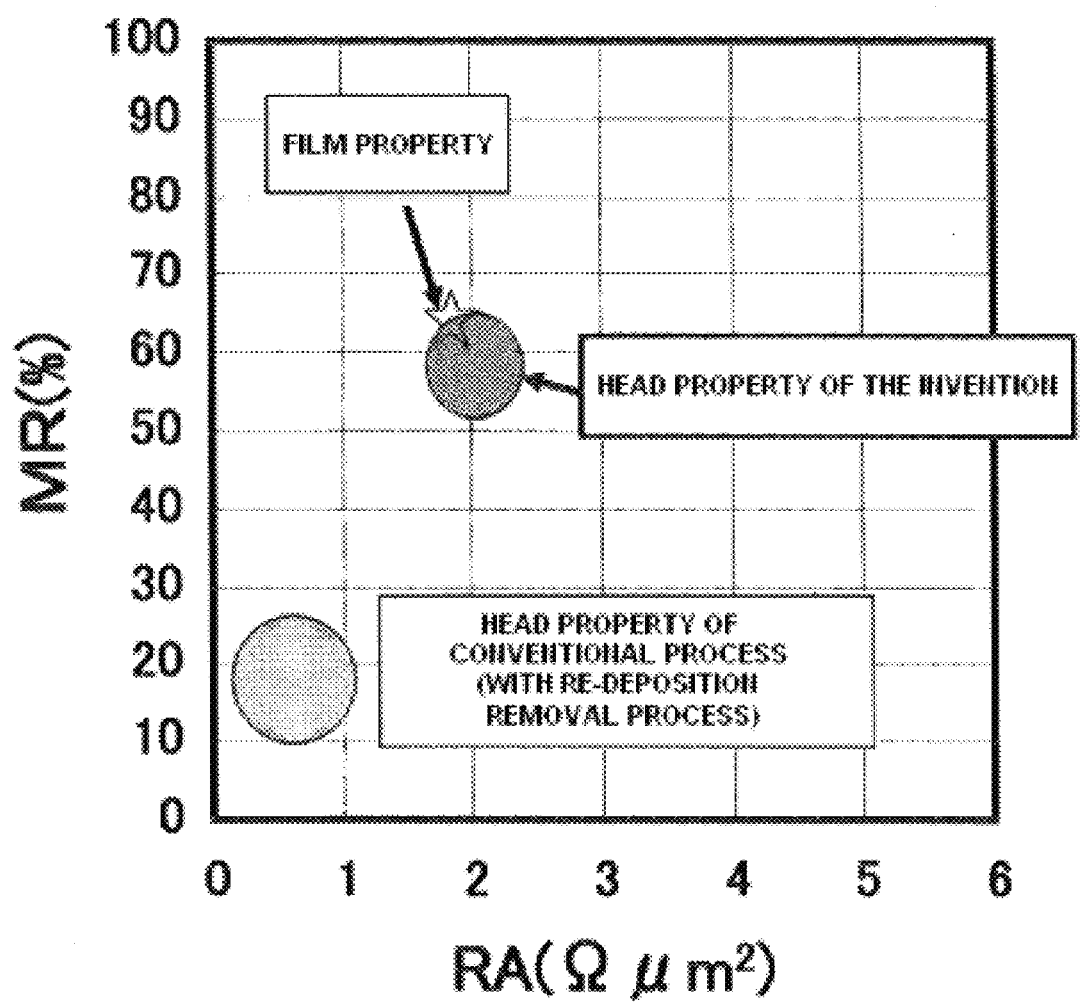
FIG. 15 is a diagram showing the comparison of the characteristic of the thin film magnetic head that is manufactured in a method of embodiments of the present invention with the characteristic of a thin film magnetic head that is manufactured in the conventional method.

FIG. 15 shows the comparison of the characteristics of the thin film magnetic head that is manufactured in the method according to embodiments of the present invention with the characteristics of the thin film magnetic head that is manufactured in the conventional method. FIG. 15 shows a resistance-area product RA and a MR ratio MR. In the case where the thin film magnetic head is manufactured in the conventional method having the re-deposition removing process, the head characteristic is remarkably deteriorated with respect to the film characteristic. On the other hand, when the thin film magnetic head is manufactured in the method according to embodiments of the present invention, the head characteristic is remarkably improved, thereby obtaining the head characteristic close to the film characteristic.

Figure 16:
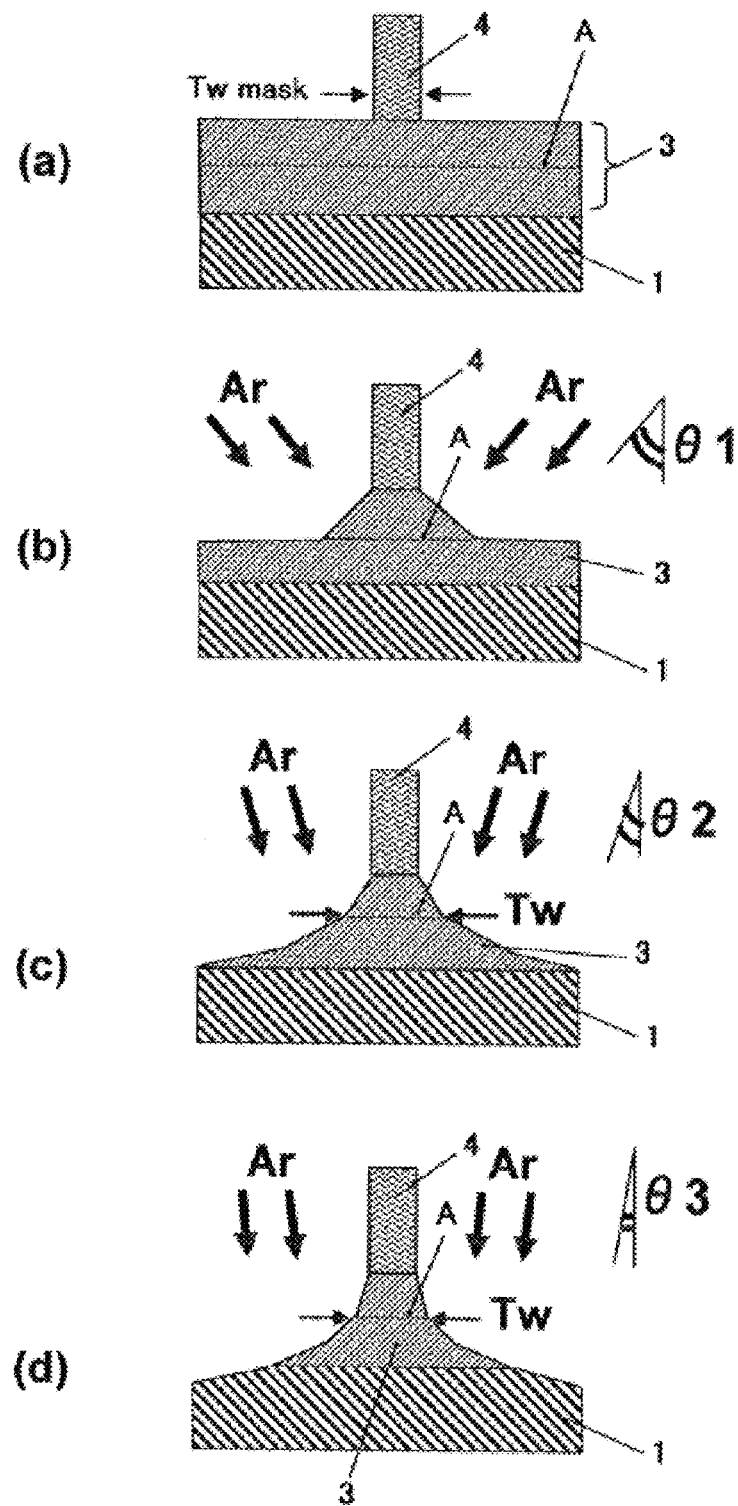
FIGS. 16(a)-16(d) are diagrams showing an example of a method of manufacturing the read head according to an embodiment of the present invention.

FIG. 16 shows a magnetic head manufacturing method according to another embodiment of the present invention. In FIG. 12, the changeover of the incident angle of etching is conducted under the two conditions, but the incident angle can be divided into more multiple stages. For example, there can be provided an incident angle θ1 of 50°, an incident angle θ2 of 35°, and an incident angle θ3 of 25°. This embodiment will be described with reference to FIG. 16. As shown in FIG. 16(a), the track forming resist mask 4 is arranged on the sensor film 3, the track forming resist mask 4 is used as an etching mask, and the sensor film 3 is etched up to the medium layer at the incident angle θ1 of 50° with the use of Ar ion milling as shown in FIG. 16(b). Then, the incident angle is changed over to the incident angle θ2 of 35°, and the sensor film 3 is etched up to the surface of the lower shield 1 as shown in FIG. 16(c). Further, the incident angle is changed over to the incident angle θ3 of 25°, and the lower shield 1 is over-etched. Similarly, in this case, it is important to decrease the incident angle as the stage is later when the incident angle is changed. When the incident angle is further divided, the configuration can be arbitrarily changed while maintaining the head characteristic.

Figure 17:
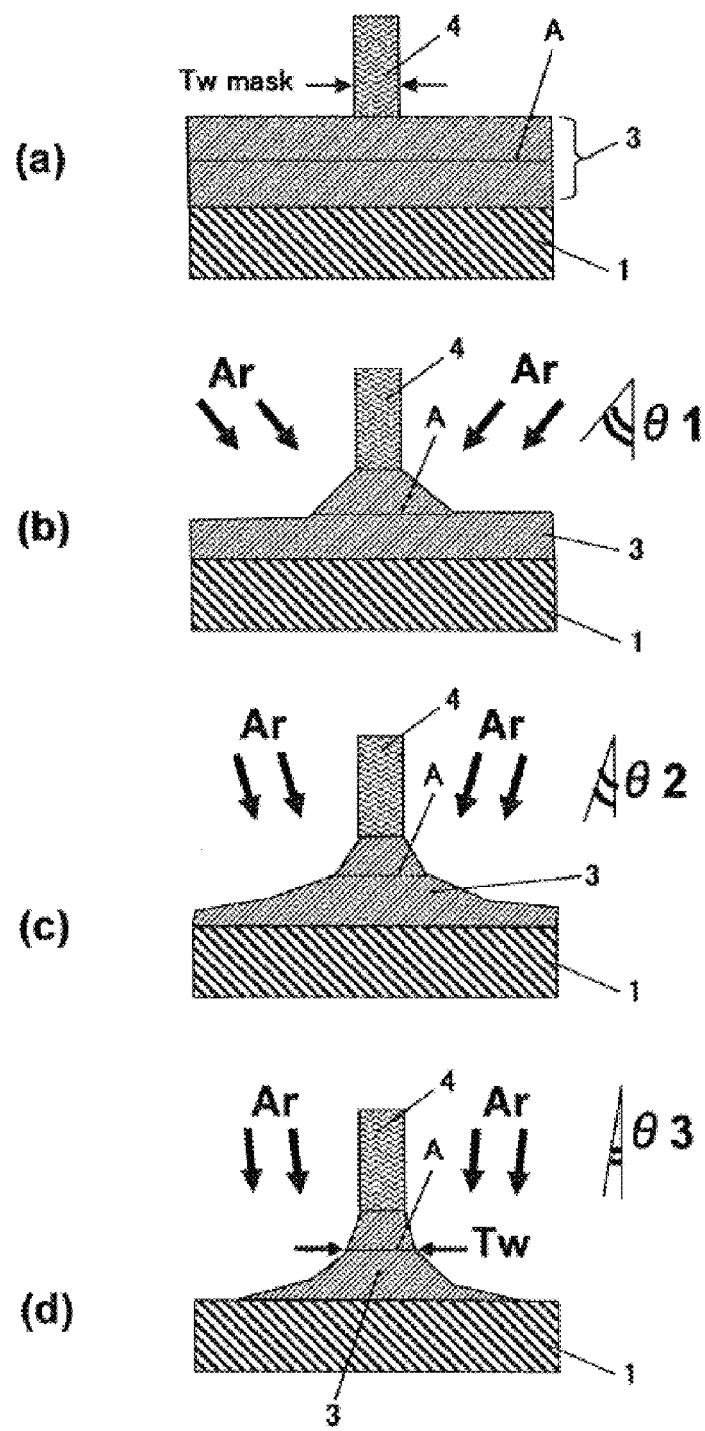
FIGS. 17(a)-17(d) are diagrams showing an example of a method of manufacturing the read head according to an embodiment of the present invention.

FIG. 17 shows a magnetic head manufacturing method according to another embodiment of the present invention. In this embodiment, the etching operation is conducted at three kinds of incident angles as in the embodiment shown in FIG. 16, but the lower shield 1 is hardly over-etched. As shown in FIG. 17(a), the track forming resist mask 4 is arranged on the sensor film 3, the track forming resist mask 4 is used as an etching mask, and the sensor film 3 is etched up to the medium layer at the incident angle θ1 of 50° with the use of Ar ion milling as shown in FIG. 17(b). Then, the incident angle is changed over to the incident angle θ2 of 30°, and the sensor film 3 is etched up to an antiferromagnetic layer as shown in FIG. 17(c). Further, the incident angle is changed over to the incident angle θ3 of 20°, and the etching operation is conducted up to the surface of the lower shield 1. The incident angles are set to the multiple stages more than that shown in FIG. 12, and the incident angle is adjusted, to thereby make it possible to narrow the track width unless over-etching is conducted.

In the above embodiments, the incident angle is changed over at the medium layer, the antiferromagnetic layer, or the lower shield. However, the changeover position can be arbitrarily set when etching is conducted while the incident angle is decreased toward the later stage. According to embodiments of the present invention, the etching operation is conducted while the re-deposition formation is prevented or reduced in the initial etching stage, to thereby enlarge the process margin of short circuit due to the re-deposition and also reduce the dimensional shift. Also, the incident angle is decreased in the later etching stage, to thereby remove the damaged layer that occurs in the initial etching stage and also narrow the track width.

The incident angle is changed at the multistage to conduct the etching process, thereby enabling another effect to be obtained. This embodiment will be described with reference to a schematic diagram of FIG. 18 showing the air bearing surface configuration of the magnetic head. FIG. 18(a) shows an example of the configuration that is formed at the single incident angle of 40°. FIG. 18(b) shows an example of the configuration that conducts etching at the incident angle θ1 of 50°, the incident angle θ2 of 30°, and over-etches the lower shield shown in FIG. 12. Both of FIGS. 18(a) and 18(b) show a state in which the insulator 5, the magnetic film (domain control film) 6, and the upper shield 11 are formed. It is found that the magnetic head of embodiments of the present invention shown in FIG. 18(b) is larger in the volume of the magnetic film 6 than that of FIG. 18(a) in a region 80 close to the sensor film 3. As described above, the etching process is conducted at the multistage, and the incident angle is decreased, thereby making it possible to prevent the characteristic deterioration due to the re-deposition, more reduce the skirt width of the sensor film 3, and more increase a portion of the magnetic film 6 in the vicinity of the sensor film. The volume of the magnetic film 6 in the vicinity of the sensor film is increased, to thereby increase the magnetic field that is applied to the end of the free layer from the magnetic film 6 and improve the stability of the sensor film 3.

Figure 19:
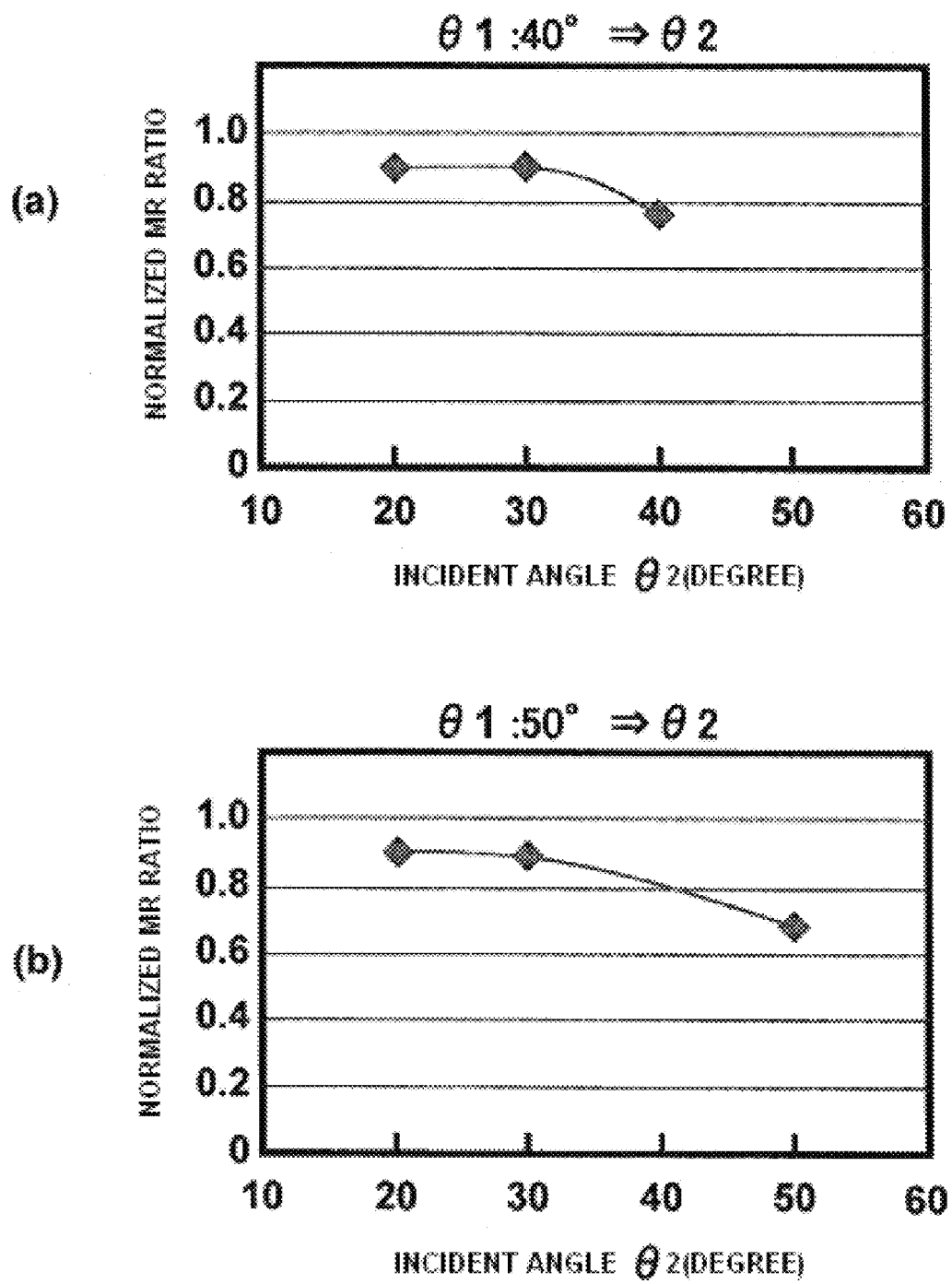
FIGS. 19(a) and 19(b) are diagrams showing a relationship between the beam incident angle at the time of etching and the characteristic of the read head.

FIG. 19(a) is a diagram showing the head characteristic in the case where the incident angle θ1 is set to 40°, and the incident angle θ2 is changed in a range of 20° to 40°. FIG. 19(b) is a diagram showing the head characteristic in the case where the incident angle θ1 is set to 50°, and the incident angle θ2 is changed in a range of 20° to 50°. The Y axis shows the MR characteristic that is normalized by the film characteristic. It is found the following fact from the figures. That is, in the case where the incident angle is not changed, that is, in the case where the incident angle is held constant to 40° or 50°, the characteristic is deteriorated. On the other hand, when the final incident angle is set to 20° to 30° as in embodiments of the present invention, the characteristic is remarkably improved. Also, the characteristic is remarkably deteriorated in the case of only the incident angle of 20° as shown in FIG. 11. On the other hand, according to embodiments of the present invention, the characteristic can be maintained even at the low incident angle. It can be recognized from this fact that the process margin is increased.

FIG. 20 shows a beam incident angle dependency and a track width dependency of the characteristics of the head that is manufactured in the manufacturing method of embodiments of the present invention. FIG. 20(a) shows the results in the case where the incident angle θ1 is set to 40°, and the incident angle θ2 is set to 20 to 30°. FIG. 20(b) shows the results in the case where the incident angle θ1 is set to 50°, and the incident angle θ2 is set to 20 to 30°. FIG. 20(a) also shows the results when the incident angle is kept constant to 40° together, and FIG. 20(b) also shows the results when the incident angle is kept constant to 50° together. The smallest dimension of the track forming resist mask 4 in this case is about 85 nm. It is apparent from FIGS. 20(a) and 20(b) that the dimensional shift is larger, and the final track width is remarkably wider in the case where the incident angle is kept constant. On the contrary, according to the manufacturing method of embodiments of the present invention, the track width close to the dimension of the track forming resist mask 4 is obtained. Further, the higher MR characteristic than that in the case of the constant incident angle is obtained. That is, according to the present invention, both of the narrowed track width and the higher MR characteristic can be achieved. Also, as described above, the excellent domain controllability is obtained on the basis of the domain control film configuration in the vicinity of the sensor film.

The above description is given mainly of the TMR head having the barrier layer made of MgO. However, embodiments of the present invention are also effective to the TMR head using another barrier layer. Also, embodiments of the present invention are effective to a CPP-GMR head. This is because the etching damage and the re-deposition are unavoidable phenomenon although the etching damage and the re-deposition slightly depend on the material.

Figure 21:
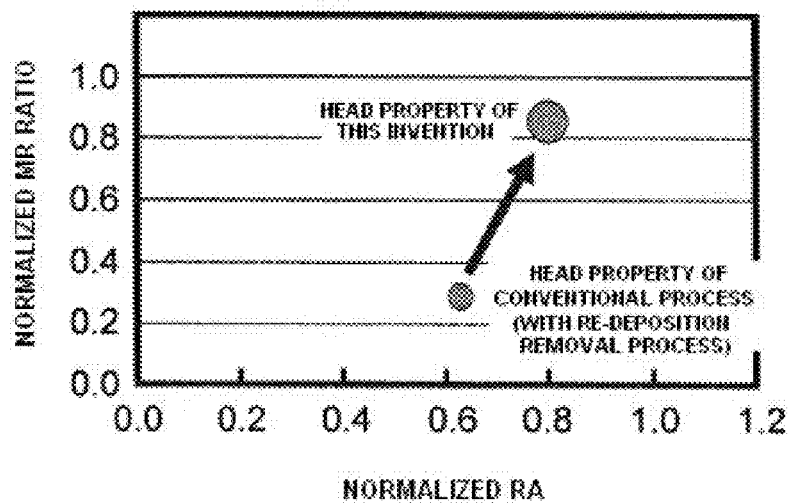
FIG. 21 is an explanatory diagram showing a characteristic improving effect in the case where an embodiment of the present invention is applied to a CPP-GMR head of the current stricture type.

FIG. 21 is an explanatory diagram showing the characteristic improving effects when embodiments of the present invention are applied to the CPP-GMR head of the current stricture type. The resistance-area product RA and the MR ratio MR shown is normalized by the film characteristic. In the case of the CPP-GMR head of the current stricture type, a CPP-GMR film of the current stricture type is used as the sensor film 3. As an example of the film structure, a metal film that is partially oxidized is disposed as the medium layer 24 of FIG. 2. In the case of the head that is manufactured in the conventional method including the re-deposition removing process, the normalized RA is about 0.6, and the normalized MR is about 0.3, which are low. On the other hand, in the case of the CPP-GMR head of the current stricture type which is manufactured in the manufacturing method of embodiments of the present invention, the normalized RA is about 0.9, and the normalized MR is about 0.8, which are remarkably improved. In this situation, the conditions are that the incident angle θ1 is 50°, and the incident angle θ2 is 30°.

Figure 22:
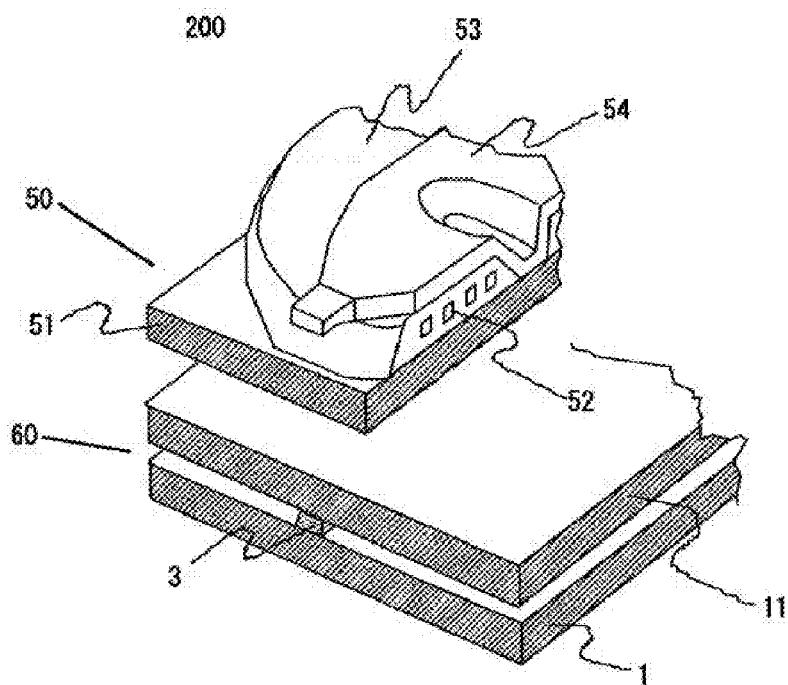
FIG. 22 is a schematic diagram showing the magnetic head.

FIG. 22 is a schematic diagram showing a structural example of a magnetic head 200 having a read head 60 and a write head 50 according to embodiments of the present invention. The write head 50 is a perpendicular write head, and has a lower pole 51, a coil 52, a coil insulator 53, and a main pole 54. The write head can be formed of a write head for longitudinal recording. The read head 60 is formed of the thin film magnetic head described in the above embodiments, and shows only the lower shield 1, the sensor film 3, and the upper shield 11, and other structural parts are omitted. The magnetic head according to embodiments of the present invention has the advantages described above, and is capable of preventing the characteristic deterioration that is attributable to the re-deposition or the damage, and obtaining the narrowed track width. The magnetic head is also capable of stabilizing the characteristic.

Figure 23:
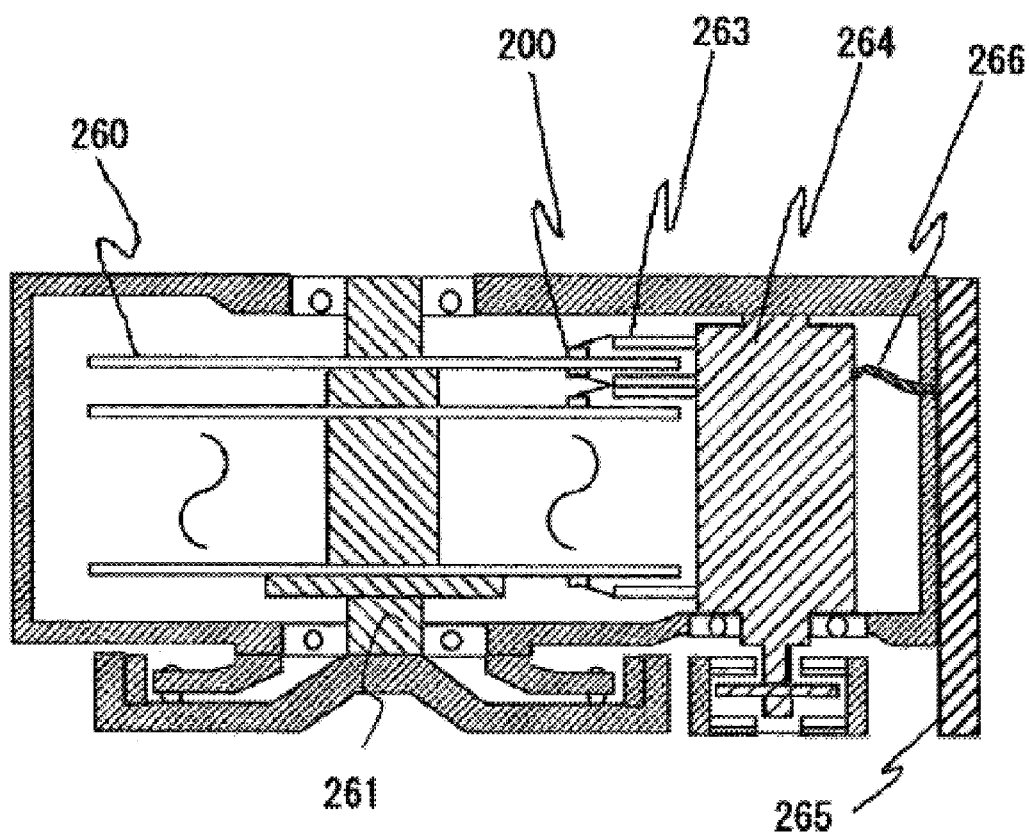
FIG. 23 is a schematic diagram showing a magnetic disc storage.

FIG. 23 is a cross-sectional schematic view showing an example of a magnetic disc storage that is equipped with the magnetic head 200 shown in FIG. 22. The magnetic disc storage includes a disc 260, a spindle motor 261 that rotationally drives the disc, a magnetic head 200, a voice coil motor 264 that positions the magnetic head 200 that is supported through gimbals 263 to a desired track of the disc, a wiring 266, and a signal processing circuit 265. The thin film magnetic head of embodiments of the present invention is equipped in the magnetic disc storage, thereby making it possible to improve the recording density and the characteristic stability as compared with the conventional art.

The present invention has been described in detail with reference to certain embodiments. Various modified configurations can be conducted on the basis of the fundamental technical concepts and description of the embodiments of the present invention. For example, in the above description, the hard magnetic film is disposed as the magnetic film 6 and used as the domain control film. Alternatively, a soft magnetic film can be disposed as the magnetic film 6 and used as a side shield film. In this case, because the domain control effect is added as the sensor film 3, additional plural magnetic layers are laminated. That is, because the thickness of the film to be etched is increased, the quantity of the re-deposition formation is increased. Since the etching method according to embodiments of the present invention is made to reduce the re-deposition formation, the etching method is also effective to the side shield structure in which the sensor film 3 is thickened. In the above description, the hard magnetic film and the soft magnetic film are disposed as the magnetic film 6. Alternatively, in order to improve those film characteristics, the hard magnetic film or the soft magnetic film which functions as the magnetic film 6 can be combined with an under film. The satisfactory thickness of the under film is several nm, and therefore the under film does not remarkably adversely affect the advantages of the present invention. Also, it is possible to combine a protective film on the hard magnetic film or the soft magnetic film.

Also, etching in the track-width direction has been described above. However, embodiments of the present invention are also effective in the etching of the element in the height direction.

The film structure of the sensor film 3 has not been described in detail. However, the advantages of embodiments of the present invention are not changed with a device that flows a detection current in a direction perpendicular to the sensor film 3.

What is claimed is:

1. A thin film magnetic head, comprising:
    a sensor film comprising a free layer, a pinned layer, and a medium layer disposed between the free and pinned layers; and
    an upper shield disposed above a top layer of the sensor film; and
    a lower shield disposed below a bottom layer of the sensor film, wherein the upper and lower shields allow a current to flow through the sensor film in a thickness direction extending between the bottom and top layers,
    wherein a relationship of $1.2 \times T \leq X$ is satisfied, wherein T is a thickness of the sensor film as measured in the thickness direction, and wherein X is a distance, in a track-width direction that is perpendicular to the thickness direction, between an end of the medium layer at a side surface of the sensor film and an end of the bottom layer at the side surface of the sensor film.

2. The thin film magnetic head according to claim 1, wherein $X \leq 2.5 \times T$ is satisfied.

3. The thin film magnetic head according to claim 1, wherein the sensor film has a skirt air bearing surface configuration such that at least a portion of the side surface of the sensor film is curved.

4. The thin film magnetic head according to claim 3, wherein an air bearing surface of the lower shield intersects with the curved portion of the side surface such that the air bearing surface extends the curvature defined by the curved portion of the side surface.

5. The thin film magnetic head according to claim 1, wherein the sensor film has a skirt air bearing surface such that a first portion of the skirt air bearing surface between the medium layer and the top layer has a dimension that is substantially constant in the track-width direction, and wherein a second portion of the skirt air bearing surface between the medium layer and the bottom layer has a curved side such that the dimension of the second portion increases as the curved side approaches the bottom layer.

6. The thin film magnetic head according to claim 1, further comprising a pair of magnetic films respectively disposed on two sides of the sensor film in the track-width direction, wherein one of the pair of magnetic films is disposed in the track-width direction from an end of the free layer at the side surface.

7. The thin film magnetic head according to claim 1, wherein the bottom layer directly contacts the lower shield.

8. The thin film magnetic head according to claim 7, wherein the bottom layer is closer to the pinned layer than to the free layer.

9. The thin film magnetic head according to claim 1, wherein the bottom layer is closer to the pinned layer than to the free layer.

10. A thin film magnetic head, comprising:
    a sensor film comprising a free layer, a pinned layer, and a medium layer disposed between the free and pinned layers;
    an upper shield disposed above a top layer of the sensor film; and
    a lower shield disposed below a bottom layer of the sensor film, wherein the upper and lower shields allow a current to flow through the sensor film in a thickness direction extending between the bottom and top layers,
    wherein a relationship of $1.2 \times T \leq X \leq 2.5 \times T$ is satisfied, wherein T is a thickness of the sensor film as measured in the thickness direction, and wherein X is a distance, in a track-width direction that is perpendicular to the thickness direction, between an end of the medium layer at a side surface of the sensor film and an end of the bottom layer at the side surface of the sensor film,
    wherein the sensor film has a skirt air bearing surface such that a first portion of the skirt air bearing surface between the medium layer and the top layer has a dimension that is substantially constant in the track-width direction, and wherein a second portion of the skirt air bearing surface between the medium layer and the bottom layer has a curved side such that the dimension of the second portion increases as the curved side approaches the bottom layer, and
    wherein an air bearing surface of the lower shield intersects with the curved side of the bottom layer such that the air bearing surface extends a curvature defined by the curved side.

11. The thin film magnetic head according to claim 10, further comprising a pair of magnetic films respectively disposed on two sides of the sensor film in the track-width direction, wherein one of the magnetic films is disposed in the track-width direction from an end of the free layer at the side surface.

12. The thin film magnetic head according to claim 11, wherein the bottom layer is closer to the pinned layer than to the free layer.

13. The thin film magnetic head according to claim 10, wherein the bottom layer directly contacts the lower shield.

* * * * *

UNITED STATES PATENT AND TRADEMARK OFFICE
CERTIFICATE OF CORRECTION

| | | |
|---|---|---|
| PATENT NO. | : 8,355,224 B2 | Page 1 of 1 |
| APPLICATION NO. | : 12/011904 | |
| DATED | : January 15, 2013 | |
| INVENTOR(S) | : Okamoto et al. | |

It is certified that error appears in the above-identified patent and that said Letters Patent is hereby corrected as shown below:

Title Page, Inventors (75):

Please delete "Shuuichi" and insert --Shuichi-- therefor.

Signed and Sealed this
Twenty-eighth Day of January, 2014

Michelle K. Lee
*Deputy Director of the United States Patent and Trademark Office*